(12) United States Patent
Martin

(10) Patent No.: US 10,164,477 B2
(45) Date of Patent: Dec. 25, 2018

(54) CONTROLLERS FOR WIRELESS POWER SYSTEMS HAVING SAFETY FUNCTIONALITY

(71) Applicant: WITRICITY CORPORATION, Watertown, MA (US)

(72) Inventor: Bradley Martin, Austin, TX (US)

(73) Assignee: WITRICITY CORPORATION, Watertown, MA (US)

( * ) Notice: Subject to any disclaimer, the term of this patent is extended or adjusted under 35 U.S.C. 154(b) by 0 days.

(21) Appl. No.: 15/689,188

(22) Filed: Aug. 29, 2017

(65) Prior Publication Data

US 2017/0358956 A1 Dec. 14, 2017

Related U.S. Application Data

(63) Continuation of application No. 15/338,914, filed on Oct. 31, 2016, now Pat. No. 9,762,093.

(60) Provisional application No. 62/247,901, filed on Oct. 29, 2015.

(51) Int. Cl.
*H02J 50/12* (2016.01)
*H02M 7/537* (2006.01)
*H02M 7/04* (2006.01)
*H02M 3/04* (2006.01)
*H03K 7/08* (2006.01)

(52) U.S. Cl.
CPC .............. *H02J 50/12* (2016.02); *H02M 3/04* (2013.01); *H02M 7/04* (2013.01); *H02M 7/537* (2013.01); *H03K 7/08* (2013.01)

(58) Field of Classification Search
CPC ............. H02J 50/12; H02M 3/04; H03K 7/08

USPC .......................................................... 343/53
See application file for complete search history.

(56) References Cited

U.S. PATENT DOCUMENTS

| 6,028,420 A * | 2/2000 | Benes ..................... G05F 1/569 323/276 |
| 7,973,585 B2 * | 7/2011 | Kubo .................. H04L 25/0272 327/309 |
| 7,977,994 B2 | 7/2011 | Yousefzadeh et al. |
| 9,755,423 B2 * | 9/2017 | Sandner ............... H02H 7/1252 |

(Continued)

FOREIGN PATENT DOCUMENTS

CN 103855928 6/2014

OTHER PUBLICATIONS

PCT International Search Report and Written Opinion dated Feb. 3, 2017 for International Application No. PCT/US2016/059672; 17 Pages.

(Continued)

*Primary Examiner* — Peguy Jean Pierre
(74) *Attorney, Agent, or Firm* — Daly, Crowley, Mofford & Durkee, LLP

(57) ABSTRACT

Methods and apparatus controlling a wireless power transmitter by applying a first low-side driver signal to a first channel in a first pair of channels and applying a first high-side driver signal to a second channel in first pair of channels, wherein each driver signal has a state that is "active" or "inactive" and drives a transistor gate of a switching element. The state of each driver signal on each channel can be monitored to detect an error condition to prevent damaging current flow condition to the switching elements. When the error condition is detected, at least one of the driver signals may be set to "inactive" for a period of time.

25 Claims, 20 Drawing Sheets

(56) References Cited

U.S. PATENT DOCUMENTS

| | | |
|---|---|---|
| 9,762,093 B2 | 9/2017 | Martin |
| 2006/0055574 A1 | 3/2006 | Maksimovic et al. |
| 2013/0082795 A1 | 4/2013 | Kris |
| 2014/0062551 A1 | 3/2014 | Bhaumik et al. |
| 2015/0340856 A1* | 11/2015 | Mallikarjunaswamy .................... H03K 17/08104 361/88 |

OTHER PUBLICATIONS

Notice of Allowance dated May 11, 2017; for U.S. Appl. No. 15/338,914; 9 pages.
PCT International Preliminary Report dated May 11, 2018 for International Application No. PCT/US2016/059672; 7 Pages.
European Official Communication pursuant to Rules 161(1) and 162 EPC dated Jun. 8, 2018 for European Application No. 16795205.0; 3 pages.

* cited by examiner

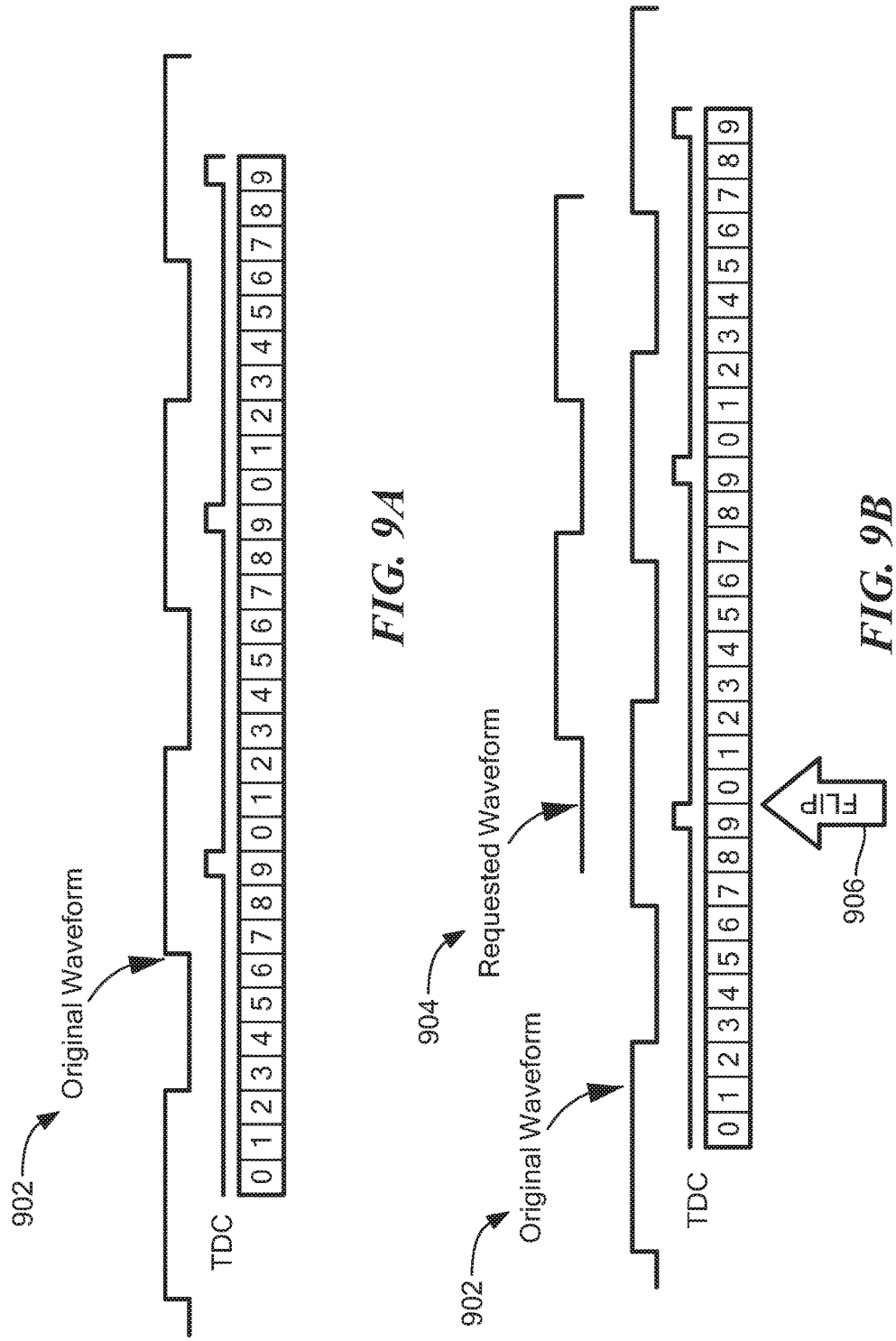

CONTROLLERS FOR WIRELESS POWER SYSTEMS HAVING SAFETY FUNCTIONALITY

CROSS-REFERENCE TO RELATED APPLICATION

This application is a continuation of U.S. patent application Ser. No. 15/338,914 entitled "CONTROLLERS FOR WIRELESS POWER SYSTEMS," filed on Oct. 31, 2016, which claims the benefit of U.S. Provisional Application No. 62/247,901 filed Oct. 29, 2015, all of which are incorporated herein by reference in their entireties.

SUMMARY

In a first aspect, the disclosure features high-resolution pulse-width modulation (HRPWM) controllers that can include a first channel having a first coarse_on register and a first coarse_off register and a counter configured to determine a repetition rate for the first channel. When a coarse_on value of the first coarse_on register and the counter are equal, the first channel can be set "active" and when a coarse_off value of the first coarse_off register and the counter are equal, the first channel can be set "inactive". The controllers can include a delay line configured to generate a set of delay locked waveforms offset by a fine resolution value and a control module configured to select a delay locked waveform from the set of delay locked waveforms and apply the selected delay locked waveform to the first channel.

Embodiments of the HRPWM controllers can include any one or more of the following features.

The HRPWM controllers can include a second channel having a second coarse_on register and a second coarse_off register to determine a second coarse resolution value associated with the second channel. The first and second channels can be configured to control a first switching element and a second switching element of a class E full-bridge inverter, class D half-bridge inverter, or a half-bridge converter. The repetition rate can equal 81.36 MHz and be divided by 12 to obtain a switching frequency of approximately 6.78 MHz.

The HRPWM controllers can include two additional channels. Each of the four channels can include configured to control a corresponding switching element of a class D full-bridge inverter. The repetition rate equals 81.36 MHz and is divided by 12 to obtain a switching frequency of approximately 6.78 MHz. Each of the four output channels can be configured to control a corresponding switching element of a converter. The repetition rate can equal 81.36 MHz and be divided by 814 to obtain a switching frequency of approximately 100 kHz. A resolution of the counter can be approximately 12.3 nanoseconds.

The delay line can be a phase-locked loop (PLL) or delay-locked loop (DLL). The fine resolution value can determine which of the set of delayed intervals is applied to a multiplexer that selects from the set of delay locked waveforms. The delay line can generate 17 equally spaced delayed intervals of approximately 723 picoseconds each.

The first coarse_on register and the first coarse_off register can determine a first coarse resolution value associated with the first channel and increasing the fine resolution value on the coarse resolution value can delay the start of first channel and reduces a pulse width of the first channel.

Setting equal the fine resolution value on the coarse_on value to the fine resolution value on the coarse_off value can maintain a pulse width of the first channel. Setting equal the fine resolution value can shift first channel from its original position.

Embodiments of HRPWM controllers can also include any of the other features disclosed herein, including any combination of features disclosed in connection with different embodiments, unless stated otherwise.

In another aspect, the disclosure features wireless power transmission systems that can include an HRPWM controller including first, second, third, and fourth channels, a converter that can include at least two converter transistors that can be controlled by the first and second channels respectively, and an inverter that can include at least two inverter transistors controlled by the third and fourth channels respectively. An output of the converter can be coupled to an input of the inverter and the inverter can be configured to drive a transmitter resonator to wirelessly transmit power to a receiver resonator.

Embodiments of wireless power transmission systems can also include any of the other features disclosed herein, including any combination of features disclosed in connection with different embodiments, unless stated otherwise.

In another aspect, the disclosure features systems that can be coupled to a wireless power transmitter. The wireless power transmitter can include a converter coupled to an inverter configured to drive a transmitter resonator to wirelessly transmit power to a receiver resonator. The systems can include a subsystem having an HRPWM controller, the HRPWM controller can include first and second channels coupled to a corresponding switching element of the converter and third and fourth output channels channel coupled to a corresponding switching element of the inverter. The systems can further include a microcontroller coupled to the subsystem via an interface, first and second voltage supplies coupled to the subsystem, and a wireless communication module coupled to the microcontroller.

Embodiments of the systems can include any one or more of the following features.

The interface can be a serial peripheral interface (SPI). The first and second voltage supplies can be 3.3 V and 5 V respectively. The wireless communication module can be Bluetooth.

Embodiments of the systems can also include any of the other features disclosed herein, including any combination of features disclosed in connection with different embodiments, unless stated otherwise.

In another aspect, the disclosure features methods to generate a first HRPWM signal. The methods can include providing a first channel having a first coarse_on register and a first coarse_off register and comparing a coarse_on value of the first coarse_on register to a counter. The counter can be configured to determine a repetition rate for the first channel. When the coarse_on value of the first coarse_on register and the counter are equal, the first channel can be set "active". The methods can include comparing a coarse_off value of the first coarse_off register to the counter. When the coarse_off value of the first coarse_off register and the counter are equal, the first channel can be set "inactive". The methods can further include generating a set of delay locked waveforms offset by a fine resolution value, and applying a selected delay locked waveform from the set of delay locked waveforms to the first channel.

Embodiments of the methods can include any one or more of the following features.

The methods can further include generating an $N^{th}$ HRPWM signal by providing a $N^{th}$ channel having a $N^{th}$ coarse_on register and a $N^{th}$ coarse_off register and comparing a coarse_on value of the $N^{th}$ coarse_on register to the counter, the counter configured to determine a repetition rate for the $N^{th}$ channel. When the coarse_on value of the $N^{th}$ coarse_on register and the counter are equal, the $N^{th}$ channel can be set "active". The methods can include comparing a coarse_off value of the $N^{th}$ coarse_off register to the counter. When the coarse_off value of the $N^{th}$ coarse_off register and the counter are equal, the $N^{th}$ channel is set "inactive". The method can include generating, via the delay line, a set of delay locked waveforms offset by a fine resolution value and applying a selected delay locked waveform from the set of delay locked waveforms to the $N^{th}$ channel.

In embodiments of the methods, N can equal two (2) and each of the two channels are configured to control a corresponding switching element of a converter or inverter. In embodiments of the methods, N can equal four (4) and each of the four channels are configured to control a corresponding switching element of a converter or inverter.

The delay line can be a phase-locked loop (PLL) or delay-locked loop (DLL). The fine resolution value can determine which of the set of delayed intervals is applied to a multiplexer that outputs the selected delay locked waveform.

The first coarse_on register and first coarse_off register can determine a first coarse resolution value and increasing the fine resolution value on the coarse resolution value can delay enable of first channel and can reduce a pulse width of the first channel. Setting equal the fine resolution value on the coarse_on value to the fine resolution value on the coarse_off value maintains a pulse width of the first channel. Setting equal the fine resolution value shifts first channel from its original position.

In a further aspect, a method for controlling a wireless power transmitter comprises: applying a first low-side driver signal to a first channel in a first pair of channels; applying a first high-side driver signal to a second channel in first pair of channels, wherein each driver signal has a state that is "active" or "inactive" and drives a transistor gate of a switching element; monitoring the state of each driver signal on each channel; detecting an error condition to prevent damaging current flow condition to the switching elements; and when the error condition is detected, setting at least one of the driver signals to "inactive" for a period of time.

A method can further include one or more of the following features: the error condition corresponds to the first low-side drive signal and the first high-side driver signal being in the "active" state, setting the state of the high-side signal on the second channel "inactive," the error condition comprises a current level exceeding a first threshold, the error condition comprises a voltage level exceeding a second threshold, inhibiting at least one of the high-side and low-side driver signals from being set "active" until the error condition is not detected, applying a second low-side driver signal to a third channel; applying a second high-side driver signal to a fourth channel, wherein the third and fourth channels comprise a second pair of channels; and wherein the second channel is coupled to a first switching element of a first bridge, the first channel is coupled to a second switching element of the first bridge, the fourth channel is coupled to a third switching element of the first bridge, and the third channel is coupled to a fourth switching element of the first bridge, the error condition corresponds to the second low-side driver signal and the second high-side driver signal being in the "active" state, the driver signals of the first and second pair of channels drive a converter circuit, the driver signals of at least a third pair of channels drive a power amplifier circuit, the driver signals of at least a third pair of channels drive a switched capacitor circuit, using a status bit to inhibit the at least one of the high-side and low-side driver signals from being set "active" until the error condition is not detected, the signal set "inactive" is the second high-side signal on the second channel, and/or setting the signal "inactive" until the inhibit status bit is cleared to 0.

In another aspect, a wireless power transmitter control system comprises: a pulse width modulation control module configured to apply a first low-side driver signal to a first channel and a first high-side driver signal to a second channel in a first pair of channels, wherein each driver signal has a state that is "active" or "inactive" and drives a transistor gate of a switching element; and a pin safety logic module configured to monitor the state of each driver signal on each channel and to detect an error condition to prevent a damaging current flow condition to the switching elements; wherein when the error condition is detected, the pin safety logic module sets at least one of the driver signals to "inactive" for a period of time.

A wireless power transmitter control system can further include one or more of the following features: the error condition corresponds to the first low-side driver signal and the first high-side driver signal being in the "active" state, the pin safety control module sets "inactive" the high-side signal on the second channel, the error condition comprises a current level exceeding a first threshold, the error condition comprises a voltage level exceeding a second threshold, the pin safety control module is configured to inhibit the at least one of the high-side and low-side driver signals from being set "active" until the error condition is not detected, a status bit is used to inhibit the at least one of the high-side and low-side driver signals from being set "active" until the error condition is not detected, a third channel and a fourth channel in a second pair of channels, the third channel having a second low-side driver signal applied to it and the fourth channel having a second high-side driver signal applied to it, the second channel is coupled to a first switching element of the first bridge, the first channel is coupled to a second switching element of a first bridge, the fourth channel is coupled to a third switching element of the first bridge, and the third channel is coupled to a fourth switching element of the first bridge, the error condition corresponds to the second low-side driver signal and the second high-side driver signal being in the "active" state, and/or the driver signals of the first and second pair of channels drive a converter circuit.

Embodiments of the methods can also include any of the other features disclosed herein, including any combination of features disclosed in connection with different embodiments, unless stated otherwise.

The details of one or more implementations of the subject matter described in this specification are set forth in the accompanying drawings and the description below. Other features, aspects, and advantages of the subject matter will be apparent from the description, the drawings, and the claims.

BRIEF DESCRIPTION OF THE DRAWINGS

FIG. 9A shows a diagram of an exemplary PWM output where the original waveform does not change state prior to crossing TDC. FIG. 9B shows a diagram of the original waveform and the requested waveform that is written to the visible register and is ready to be flipped into operation.

Like reference numbers and designations in the various drawings indicate like elements.

DETAILED DESCRIPTION

Introduction to Wireless Power Systems

Wireless energy transfer systems described herein can be implemented using a wide variety of resonators and resonant objects. As those skilled in the art will recognize, important considerations for resonator-based power transfer include resonator quality factor and resonator coupling. Extensive discussion of such issues, e.g., coupled mode theory (CMT), coupling coefficients and factors, quality factors (also referred to as Q-factors), and impedance matching is provided, for example, in U.S. patent application Ser. No. 13/428,142, published on Jul. 19, 2012 as U.S. 2012/0184338, in U.S. patent application Ser. No. 13/567,893, published on Feb. 7, 2013 as U.S. 2013/0033118, in U.S. patent application Ser. No. 14/059,094, published on Apr. 24, 2014 as U.S. 2014/0111019, in U.S. patent application Ser. No. 12/986,018, published on Aug. 11, 2011 as U.S.2011/0193416, in U.S. patent application Ser. No. 14/745,041, published on Dec. 24, 2015 as U.S.2015/0372495, in U.S. patent application Ser. No. 14/688,432, published Oct. 22, 2015 as U.S.2015/0303708, and in U.S. patent application Ser. No. 14/525,485, published on Mar. 5, 2015 as U.S.2015/0061404. The entire contents of each of these applications are incorporated by reference herein.

Power transfer systems may rely on electronic circuits such as AC (Alternating Current) to DC (Direct Current) converters, inverters, amplifiers, rectifiers, DC to DC converters, impedance matching circuits, and other power electronics to condition, monitor, maintain, and/or modify the characteristics of the voltage and/or current used to provide power to electronic devices.

Embodiments of the invention provide methods and apparatuses for highly resonant wireless power transfer systems having wireless power transmission units. Transmitted power can be accurately controlled with sensors, amplifiers, control systems, computer processors, wireless communications, oscillators, and pulse-width modulation (PWM) controllers.

Figure 1:
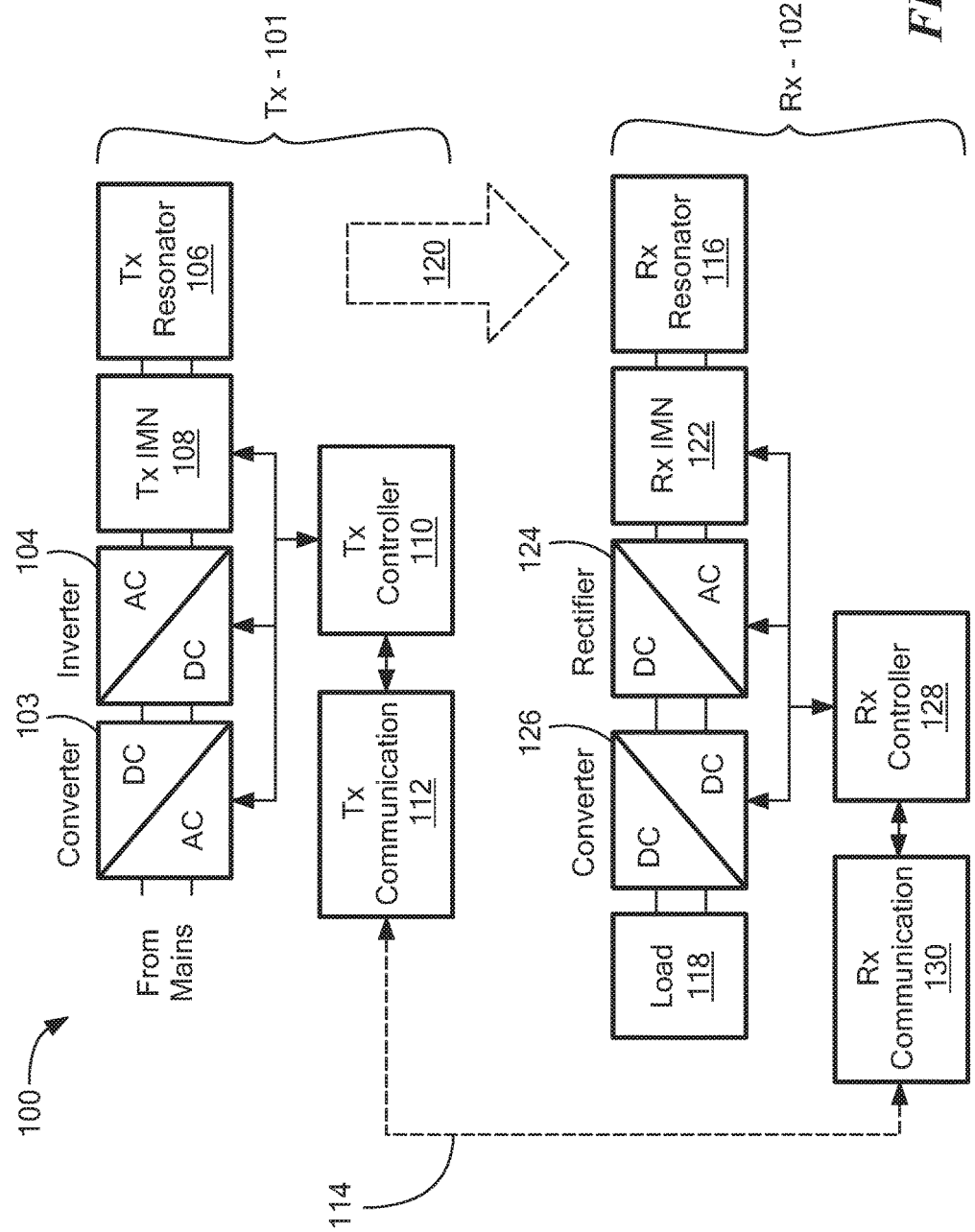
FIG. 1 shows a high level functional block diagram of an exemplary wireless power system including a wireless power transmitter and wireless power receiver.

FIG. 1 shows a high level functional block diagram of an exemplary wireless power system 100 including a wireless power transmitter 101 and wireless power receiver 102. Input power to the system is provided by wall power (AC mains), for example, which is converted to DC in an AC/DC converter block 103. Alternatively, a DC voltage can be provided directly from a battery or other DC supply. A power factor correction stage (not shown) may also be included in this system. A high efficiency switching inverter or amplifier 104 converts the DC voltage into an AC voltage waveform used to drive a transmitter resonator 106. A transmitter impedance matching network (Tx IMN) 108 efficiently couples the amplifier 104 output to the transmitter resonator 106 and can enable efficient switching-amplifier operation. Class D or E switching amplifiers are suitable in many applications and generally require an inductive load impedance for highest efficiency. The components of the transmitter 101 can be controlled by a transmitter controller 110. Further, a wireless communication module 112 can be coupled to the transmitter to facilitate communication 114 with a receiver 102 or other system, such as a server or another wireless power transmitter.

The IMN 108 transforms the transmitter resonator 106 impedance, which is loaded by the coupling to a receiver resonator 116 and output load 118, into such an impedance for the transmitter amplifier. The oscillating magnetic field 120 generated by the transmitter resonator 106 couples to the receiver resonator 116. The received energy is coupled out of the receiver resonator 116 to, for example, directly power a load 118 or charge a battery. A receiver impedance matching network (Rx IMN) 122 may be used here to efficiently couple energy from the receiver resonator 116 to a load 118. It may transform the actual load impedance into an effective load impedance seen by the receiver resonator which more closely matches the loading for optimum efficiency. For loads requiring a DC voltage, a rectifier 124 converts the received AC power back into DC. In some embodiments, an additional stage such as a voltage clamp, smoothing capacitor, and/or DC/DC converter 126 can be coupled between the rectifier 124 and load 118. In embodiments, the components of the receiver 102 can be controlled by a receiver controller 128. A wireless communication module 130 can be coupled to the receiver to facilitate communication 114 with a transmitter 101 or other system, such as a server or another receiver.

Application Specific Integrated Circuit (ASIC) Overview

Figure 2:
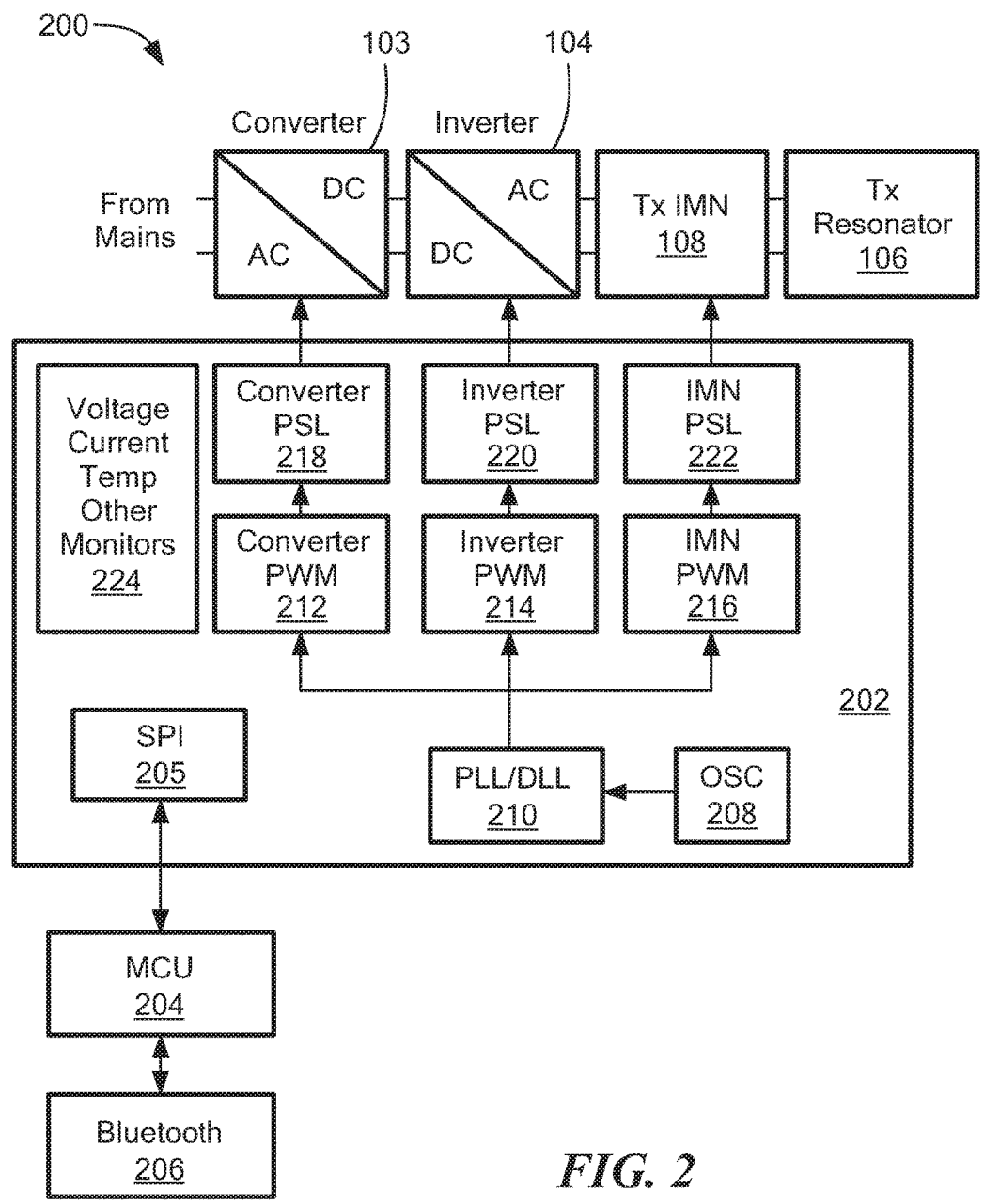
FIG. 2 shows a functional block diagram of an exemplary wireless power transmitter implementation.

FIG. 2 shows a functional block diagram 200 of an exemplary wireless power transmitter implementation. A transmitter control system 202, which can be provided as an integrated circuit (IC), such as an application specific integrated circuit (ASIC), is coupled to a computer processor 204, which can be provided as a microcontroller via a serial peripheral interface (SPI) 205, and a wireless communication system 206, which can be provided as Bluetooth, radio, WiFi, and the like. The transmitter control system 202 is coupled to a AC/DC converter 103, which can be a Buck-Boost type AC/DC converter, an amplifier 104, such as Class D amplifier, and an impedance matching network (IMN) 108, which is coupled to a transmitter resonator 106.

The transmitter control system 202 includes an internal or external oscillator 208 coupled to a phase locked loop (PLL)/delay locked loop (DLL) module 210. A converter pulse width modulation (PWM) module 212 receives timing signals from the PLL/DLL module 210 and generates drive signals for switching elements in the AC/DC converter 103. In embodiments, the AC/DC converter 103 includes switching elements such as transistors configured in a half-bridge or full-bridge configuration. An inverter PWM module 214 receives timing signals from the PLL/DLL module 210 and generates drive signals for switching elements in the inverter 104. In embodiments, the inverter 104 can be of class D, E, or DE having transistors configured in a half-bridge or full-bridge configuration. An impedance adjustment PWM module 216 receives timing signals from the PLL/DLL module 210 and generates control signals for the IMN 108.

In embodiments, pin safety logic (PSL) is provided for one or more of the converter PWM module 212, inverter PWM module 214, and/or impedance adjustment PWM module 216 to prevent the occurrence of undesirable or unsafe switching element conditions, as described more fully below. In the illustrated embodiment, a converter PSL module 218 is coupled between the converter PWM module 212 and the AC/DC converter 103, an inverter PSL module 220 is coupled between the inverter PWM module 214 and the inverter 104, and an impedance adjustment PSL module 222 is coupled between the impedance adjustment PWM module 216 and the IMN 108. Illustrative PSL modules are described more fully below.

In embodiments, the transmitter control system 202 can include sensors 224 such as voltage, current, temperature, and/or power sensors to monitor the wireless power transmitter. Signals from these sensors 224 can be used to provide feedback to various components of the control system 202 such as the PWM modules (212, 214, 216), PSL modules (218, 220, 222), microcontroller 204, and the like.

High-Resolution Pulse Width Modulation (HRPWM)

In embodiments, pulse width modulation (PWM) can be used to control components of the wireless power system. It is beneficial to the operation of the system for these PWM signals to be highly precise and accurate. In embodiments, a high resolution pulse width modulation (HRPWM) controller can be used to generate and control such signals. The HRPWM controller can be considered a hybrid controller, utilizing a delay line and digital control. An exemplary HRPWM module can include a single, two, three, four, or more output channels assigned to a common group. A master counter can determine the repetition rate for the output channels within the group. The resolution of the counter, for this example, is based on the 81.36 MHz clock frequency and is approximately 12.3 nanoseconds.

Figure 3A:
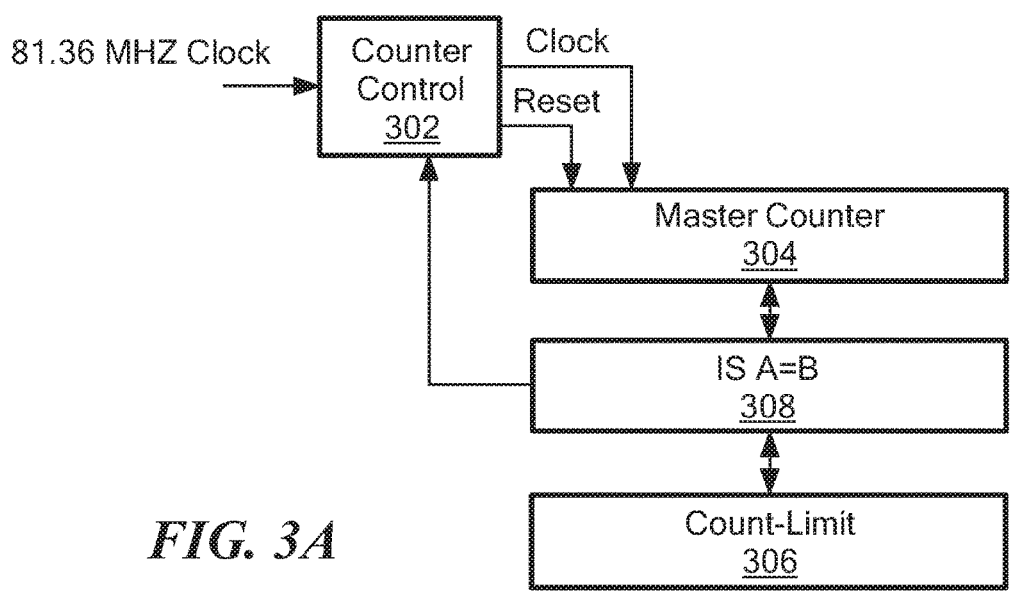
FIG. 3A shows a diagram of an exemplary embodiment of the counter control mechanism.
Figure 3B:
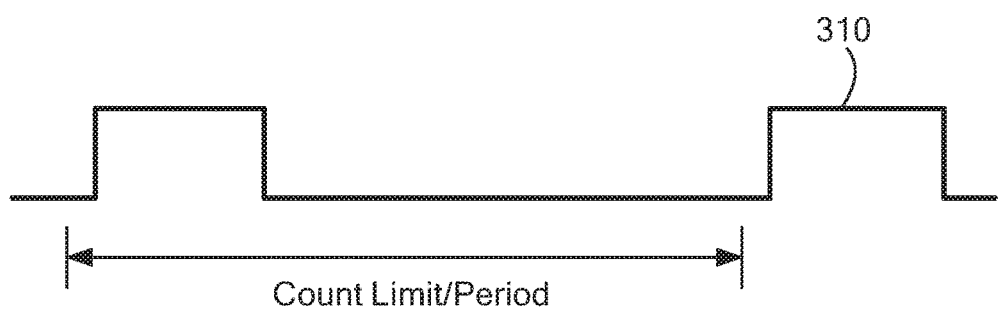
FIG. 3B shows a diagram of an exemplary waveform to illustrate a period.

FIG. 3A shows a diagram of an exemplary embodiment of the counter control mechanism. An 81.36 MHz clock frequency is input to the counter controller 302 which provides the clock for the master counter 304. The COUNT_LIMIT register 306 provides an integer count of the period of the 81.36 MHz clock frequency (see FIG. 3B). COUNT_LIMIT 306 is compared to the master counter 304 value in element 308 and fed back to counter controller 302. When the COUNT_LIMIT is equal, the comparator resets the counter and thus, defines the period of an HRPWM channel 310, as shown in FIG. 3B. Note that a master counter is provided for each HRPWM channel.

In embodiments, each output channel can be independently set or cleared by the value of its respective COARSE_ON and COARSE_OFF registers. The output channel is set "active" when its COARSE_ON value and the master counter are equal and "inactive" upon a match to the COARSE_OFF value.

Figure 4:
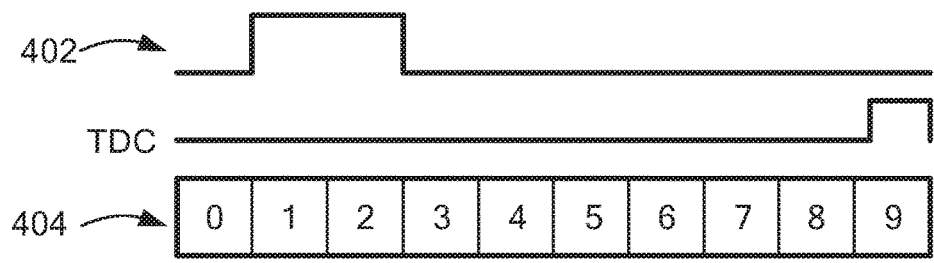
FIG. 4 shows an example of a wave output that starts at count 1 and stops at count 3 (as denoted by counter).

For example, independent channel configuration capability allows for varying duty cycles for single channel, half-bridge, or full-bridge configurations of power stages in a wireless power system. FIG. 4 shows an example of a waveform 402 that starts at count 1 and stops at count 3 (as denoted by counter 404). Note that the top dead center (TDC) waveform, provided as a reference, starts at count 9 and stops at the next count (count 0). The TDC is the home position for the waveform 402.

Figure 5:
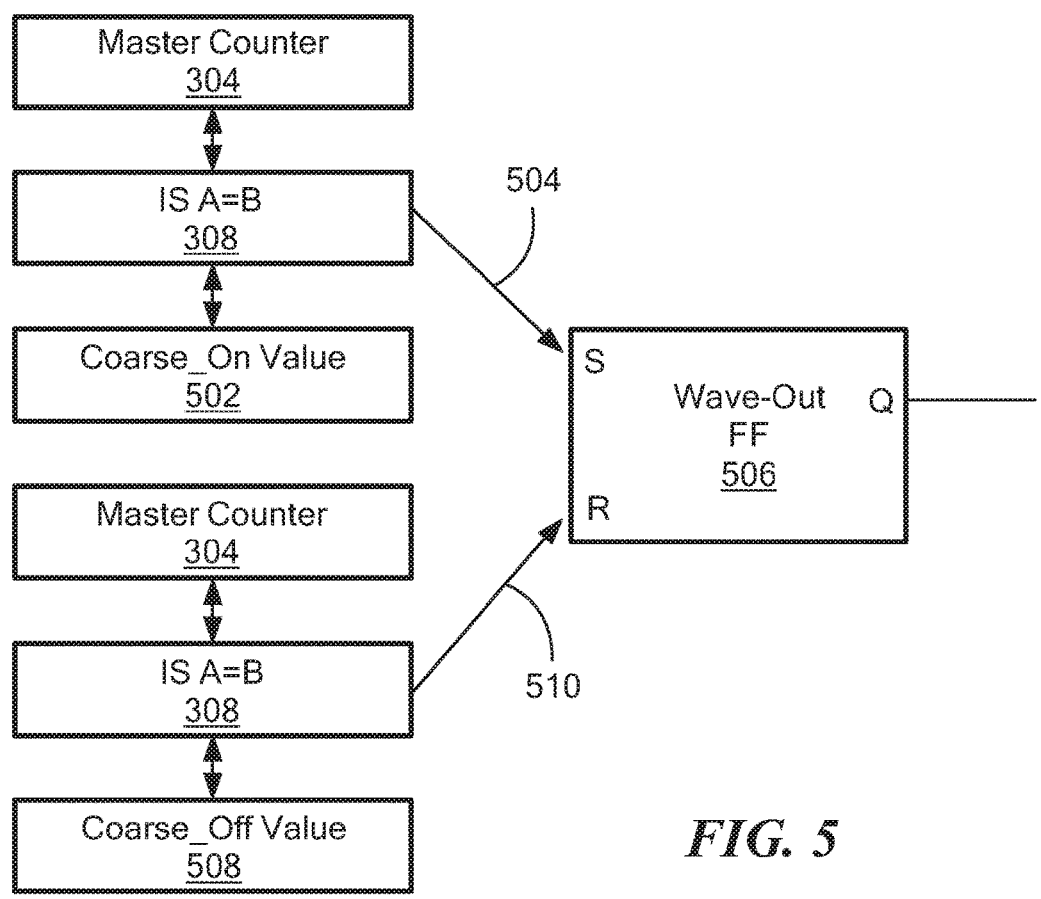
FIG. 5 shows a representation of the register comparison for a set and clear operation.

FIG. 5 shows a representation of the register comparison for a set and clear operation. The master counter 304 value is compared to the COARSE_ON value 502 and the output 504 is provided to set/reset or flip-flop latch 506 to set the channel output. In other words, the output goes high when the master counter 304 equals the COARSE_ON value 502. The master counter 304 value is compared to the COARSE_OFF value 508 and the output 510 is provided to 506 to reset the channel output. When the master counter 304 equals COARSE_OFF value 508, the output goes low. In the example shown in FIG. 4, when the COARSE_ON value equals the master counter at count 1, the output (or waveform) goes high and, when the COARSE_OFF value equals the master counter at count 3, the output goes low.

Coarse and Fine Resolution Control

In embodiments, the fine resolution value is generated by a delay line. For example, the fine resolution value can be provided by the analog output taps of the phase locked loop (PLL) delay line. The output from the PLL circuit can generate 17 equally spaced delayed clocks (or waveforms) with intervals of about 720 picoseconds. The HRPWM coarse resolution value creates a "window" for the output from the PLL delay line. The fine resolution value in the FINE offset register determines which of the 17 delay taps should clock the channels control logic. In other words, the fine resolution value is selected from a section of a set of delay locked waveforms from the delay line. In embodiments, each of the FINE offset registers, FINE_ON register and FINE_off, can each have fine resolution values.

Figure 6A:
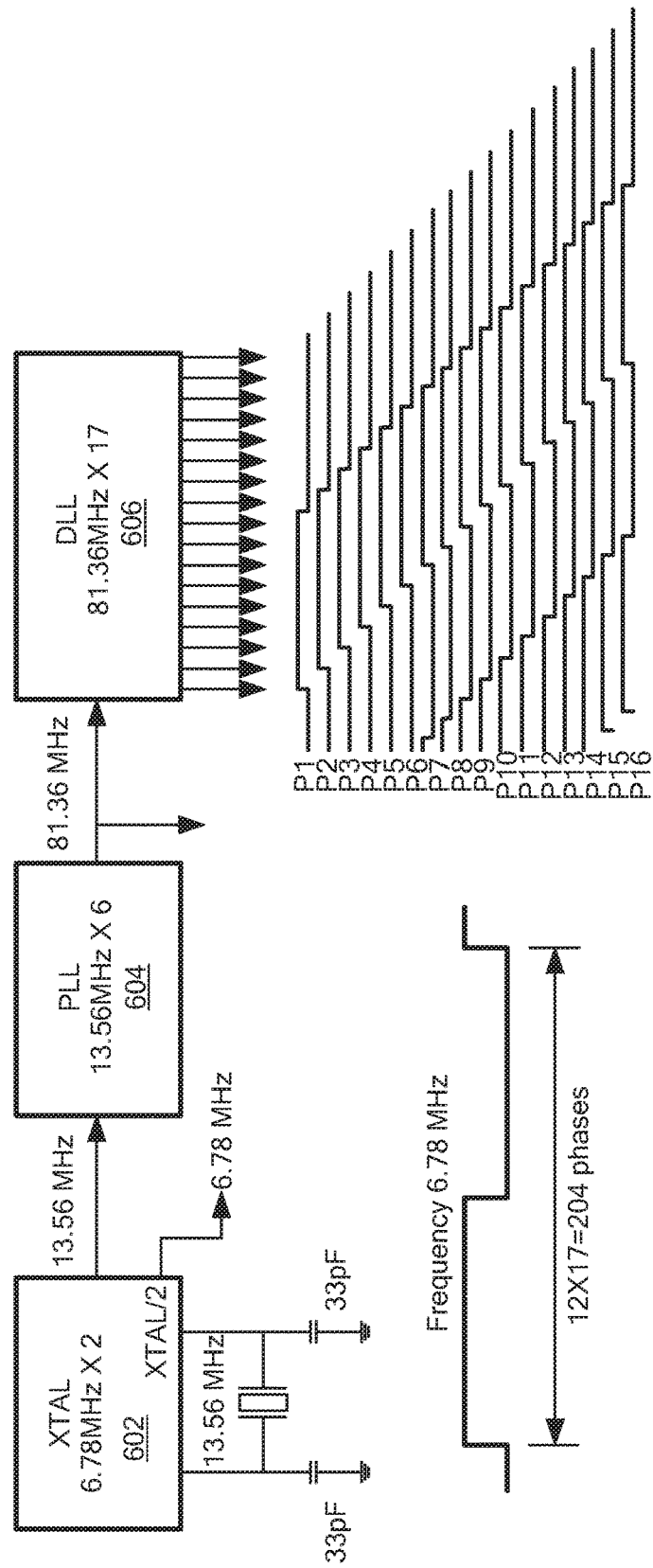
FIG. 6A shows an oscillator configured to generate a 13.56 MHz (6.78 MHz×2) signal used to generate a set of delay locked waveforms.
Figure 6B:
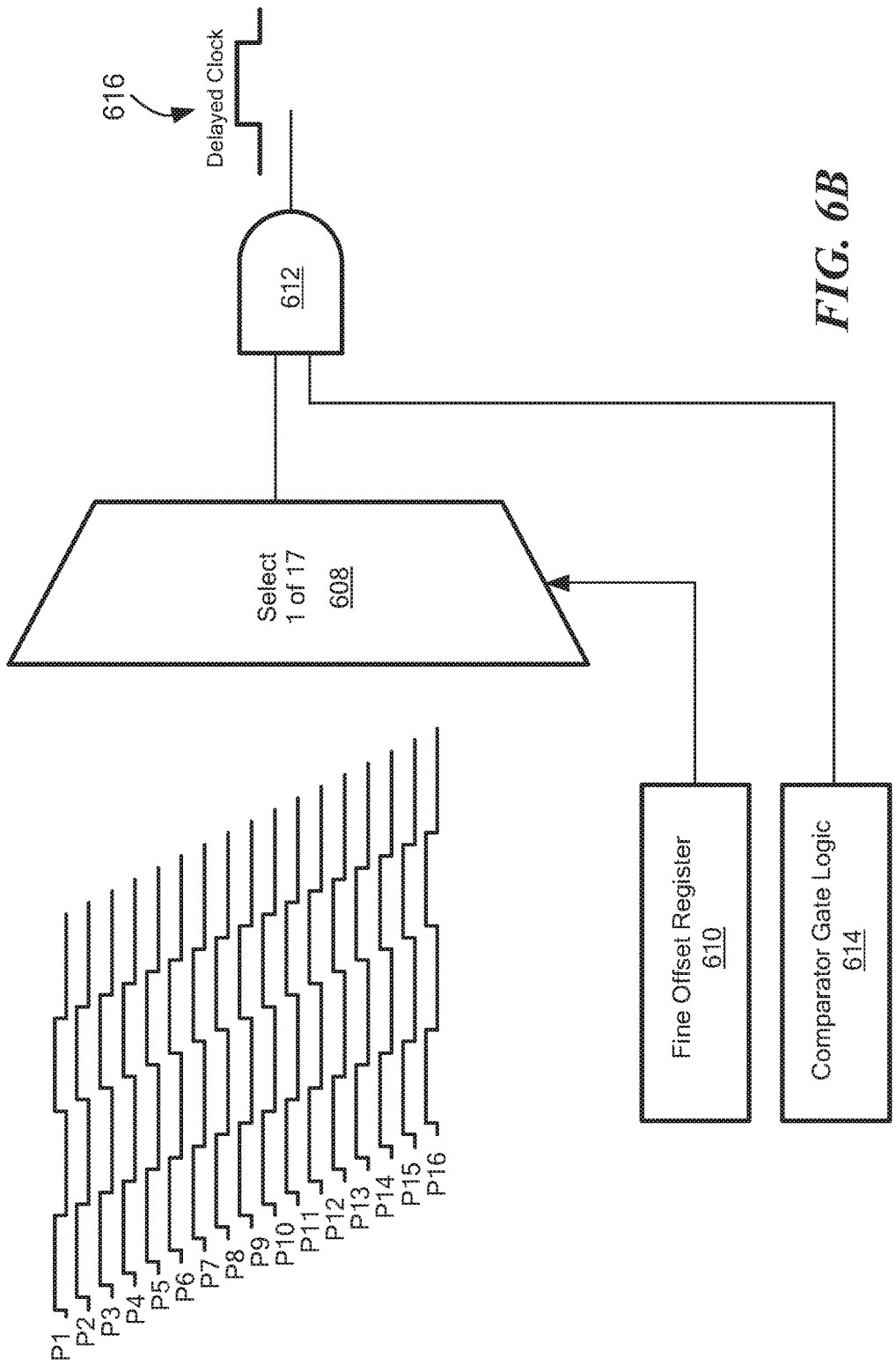
FIG. 6B shows a set of delay locked waveforms provided to multiplexer.

FIG. 6A shows an oscillator 602 configured to generate a 13.56 MHz (6.78 MHz×2) signal, which is provided to a phase locked loop (PLL) 604, which generates an 81.36 MHz signal (13.56 MHz×6). A delay locked loop (DLL) 606 circuit receives the 81.36 MHz signal and generates 17 pulses (P0-P16) with a phase resolution of 723 picoseconds. Pulses P0-P16 are used to provide fine resolution for the PWM pulses. It is understood that all values are merely illustrative and that any practical values can be used to meet the needs of a particular application. FIG. 6B shows a set of delay locked waveforms (P0-P16) provided to multiplexer 608 and the fine offset register 610 selects one of the 17 waveforms. This output is provided to AND logic gate 612 with comparator gate logic 614. This results in a delayed output waveform 616.

Figure 7A:
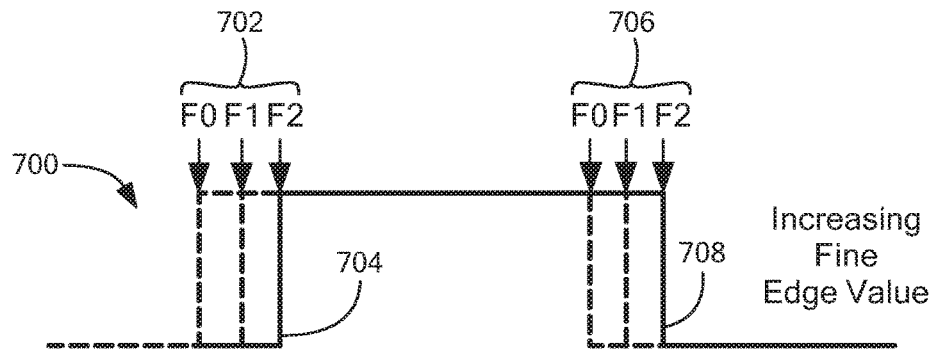
FIG. 7A shows the increasing of the fine resolution value on the COARSE_ON value.
Figure 7B:
FIG. 7B shows the setting of equal fine resolution values for the COARSE_ON and COARSE_OFF registers.

Note that the fine resolution value has opposite effects on the HRPWM output depending if is applied to the COARSE_ON or COARSE_OFF values. FIG. 7A shows that increasing the fine resolution value on the COARSE_ON value (at 702) delays (denoted by dashed line) the start of the enable (rising edge 704 of pulse) of waveform wave[n] 700 (where n is the output channel) and reduces the pulse width. Increasing the fine resolution value on the COARSE_OFF value (at 706) delays the disable (falling edge 708) of wave[n] and increases the pulse width. FIG. 7B shows that setting equal fine resolution values for the COARSE_ON and COARSE_OFF registers maintains the pulse width of the waveform 710 but can shift the pulse further away from top dead center (TDC) starting point depending on the fine resolution value. For example, if the fine resolution value for both COARSE_ON and COARSE_OFF is set to be P3, then the pulse width is maintained but shifted by 3 times the interval defined by the fine resolution value.

Register Configuration

Figure 8:
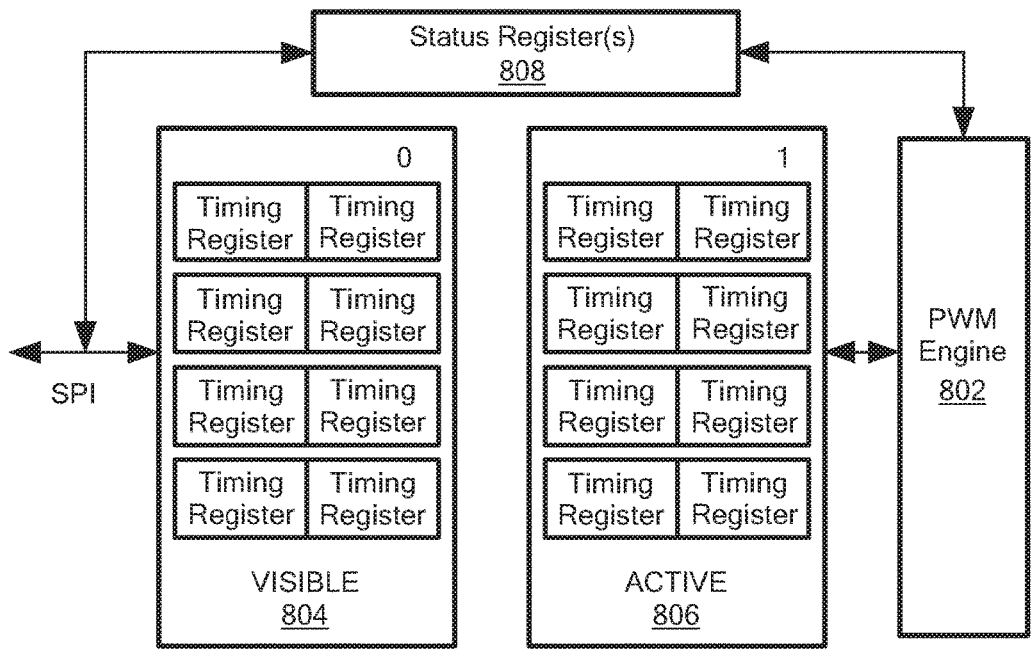
FIG. 8 shows the dividing of the timing register into two sets of registers, visible and active.

In embodiments, modification of the timing values when the PWM engine is running may result in undesirable operation. As shown in FIG. 8, to mitigate this potential problem, the timing register can be divided into two sets of registers: a "visible" register 804 that is visible to the serial peripheral interface (SPI) and an "active" register 806 running the PWM engine 802. Modification to the visible register 804 is isolated and does not affect the operation of the PWM engine 802. Note that the status register(s) 808 is coupled to both the SPI and PWM engine 802.

In embodiments, the visible and active registers can be exchanged when the counter is at the home or top dead center (TDC) position. To execute an exchange, a FLIP bit is set in the respective control register as a request for register exchange. The FLIP bit is cleared when the exchange has been executed. The STATE bit indicates which register pair is visible to the SPI. If the PWM engine 802 is running, the FLIP will occur at the next top dead center timing. If the engine is not running, the FLIP occurs immediately. If the active register set has not been initialized (reset state), the FLIP bit should be set prior to the run bit. Note that setting both bits in the same operation may result in undesirable operation.

Run Operation

In embodiments, start and stop operations of the PWM engine 802 are referenced to the TDC position. When the PWM engine 802 is not running, the counter WAVE[x] bits are clear and wave[n] output signals are inactive. When the RUN/STOP bit is set, the counter will increment and the outputs will change state according to the values in the SET and CLEAR registers. To request a stop for the PWM engine 802, the RUN/STOP bit is cleared. The PWM engine 802 will continue to run until the PWM engine 802 reaches TDC. The wave[n] outputs will return to the inactive state. The polarity of the general-purpose input/output (GPIO) pins used for PWM operation is not affected by forcing the wave[n] outputs to the inactive state.

External Control

In embodiments, the HRPWM have the capability for an external flip request and/or an external START_STOP request through the GPIO pins. For instance, the external START_STOP request may be used for some form of binary keying. By creating two different configurations for the register sets, such as a frequency shift keying (FSK) or amplitude shift keying (ASK), one can flip between the two configurations. For examples of signaling using these registers, see section "In-band signaling".

To enable the external flip, the FLIP_IN[1:0] bits can be used to choose which GPIO pin to use and enable the EX_FLIP bit. The rising edge on the GPIO pin schedules the flip for the next TDC. To enable the external RUN_STOP, select which GPIO port to use and set the EX_RUN bit. The PWM engine will run when the GPIO pin is active. When the GPIO pin is returned to inactive, the PWM engine will run until the next TDC.

Force Condition

In embodiments, the "force" mechanism can be used to avoid some potential output overlap conditions that may create system faults when the register values for the PWM engine are updated. The FORCE bit sets or clears the PWM output at TDC instead than waiting for the ON/OFF timing to be met. The engine forces a PWM output to a known state when three conditions are met:

1. The FORCE[x] bit is set in either the COARSE_ON or COARSE_OFF register. The FORCE_TO bit determines the polarity of the new condition.
2. A "flip" is scheduled to exchange the visible register set and the active register set.
3. The update occurs at TDC.

The FORCE is a synchronized event and the three above conditions should be reset to repeat the FORCE mechanism. Although the FORCE_TO and FORCE bits are shown in the COARSE_ON and COARSE_OFF registers, note that an undetermined condition cannot be created by setting a 'one' in one register and a 'zero' in the other. Those bits are mirrored in each register; a write to one results in the write to other for those two bits.

Figure 9C:
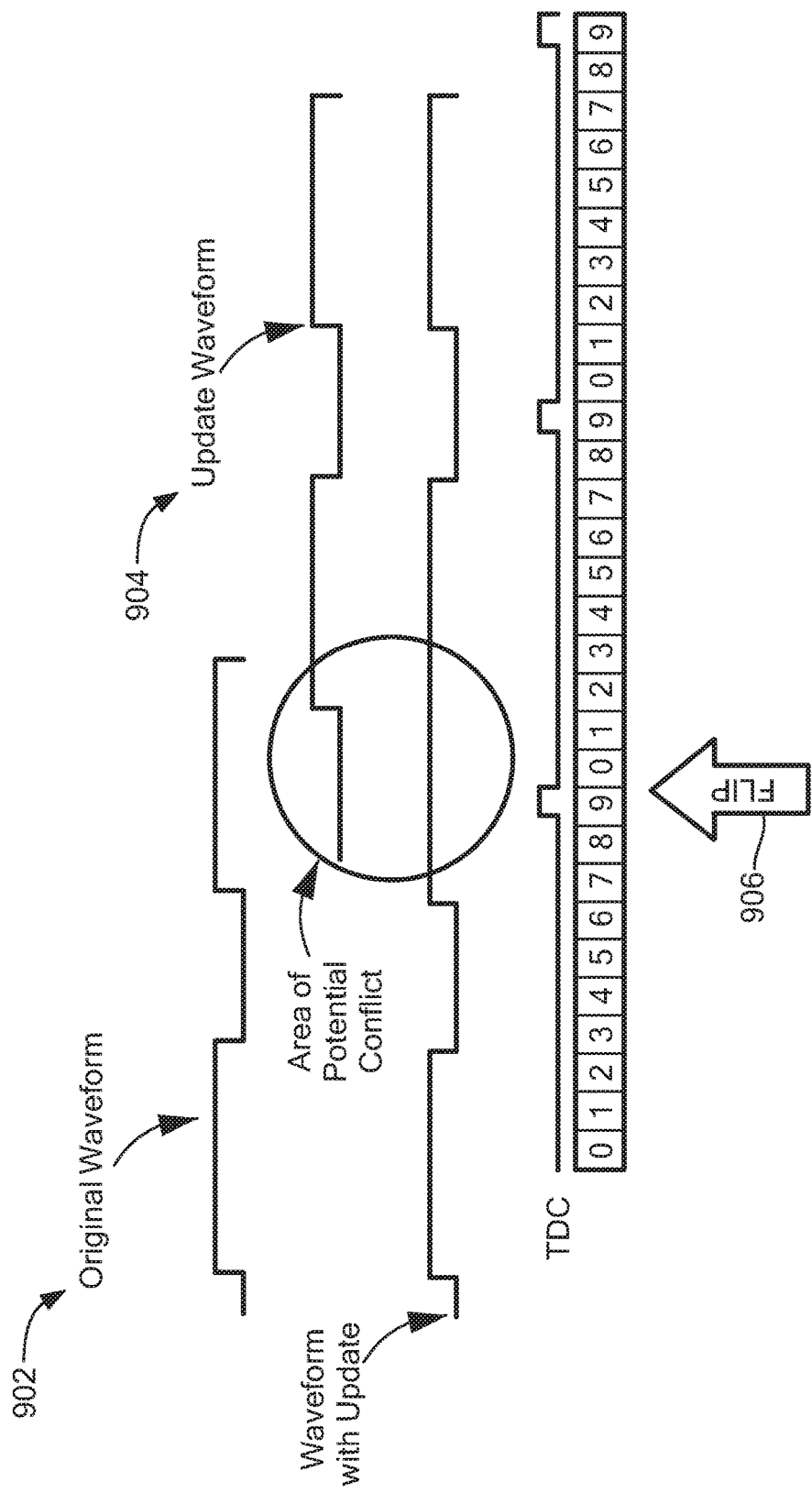
FIG. 9C shows a diagram that when the FLIP occurs, the output is set to a logic 1 prior to the FLIP.
Figure 9D:
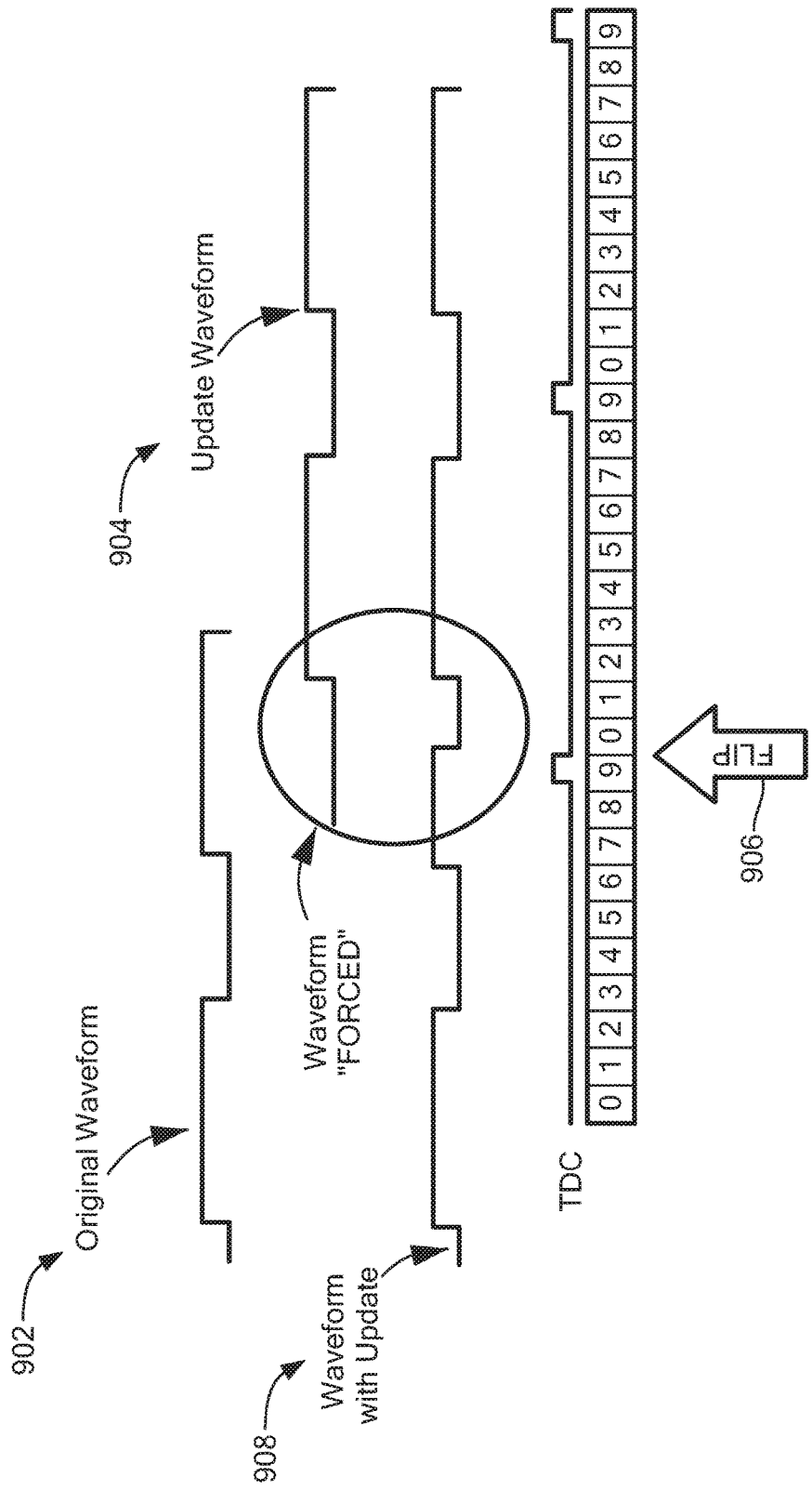
FIG. 9D shows a diagram of resulting waveform that used the FORCE to set the output to the desired state for the updated waveform. Note that just after the flip, the potential overlapping condition is removed.

FIG. 9A shows an exemplary PWM output where the original waveform 902 does not change state prior to crossing TDC. FIG. 9B shows the original waveform 902 and the requested waveform 904 that is written to the visible register and is ready to be flipped into operation. When the FLIP occurs (denoted by FLIP arrow 906), as shown in FIG. 9C, the output is set to a logic 1 prior to the FLIP. The desired output of the new waveform is indicating that the waveform should be at logic 0 after TDC. The COARSE_OFF timing value does not clear the output until the following PWM cycle. This may result in a fault condition especially if the PWM engine is driving a full or half-bridge configuration. FIG. 9D shows a resulting waveform (waveform with update 908) that used the FORCE operation to set the output to the desired state for the updated waveform. Note that just after the flip, the potential overlapping condition is removed.

Applications of HRPWM to Wireless Power Transmission Systems

In embodiments, PWM can be used to control switching devices in a converter or inverter. The longer the switching devices are on compared to off periods, the higher the total power supplied to the load. The term duty cycle, which is generally a percentage, describes the proportion of switching device on time versus off time. A low duty cycle corresponds to low power, because the power is off for most of the time.

Figure 10A:
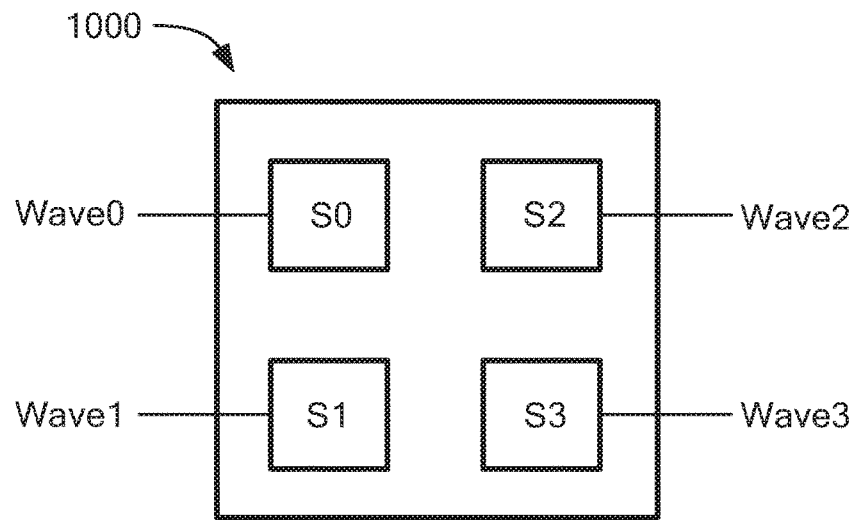
FIG. 10A shows a diagram of a DC converter having switching elements S1-S3 controlled by PWM drive signals Wave0-3, respectively.
Figure 10B:
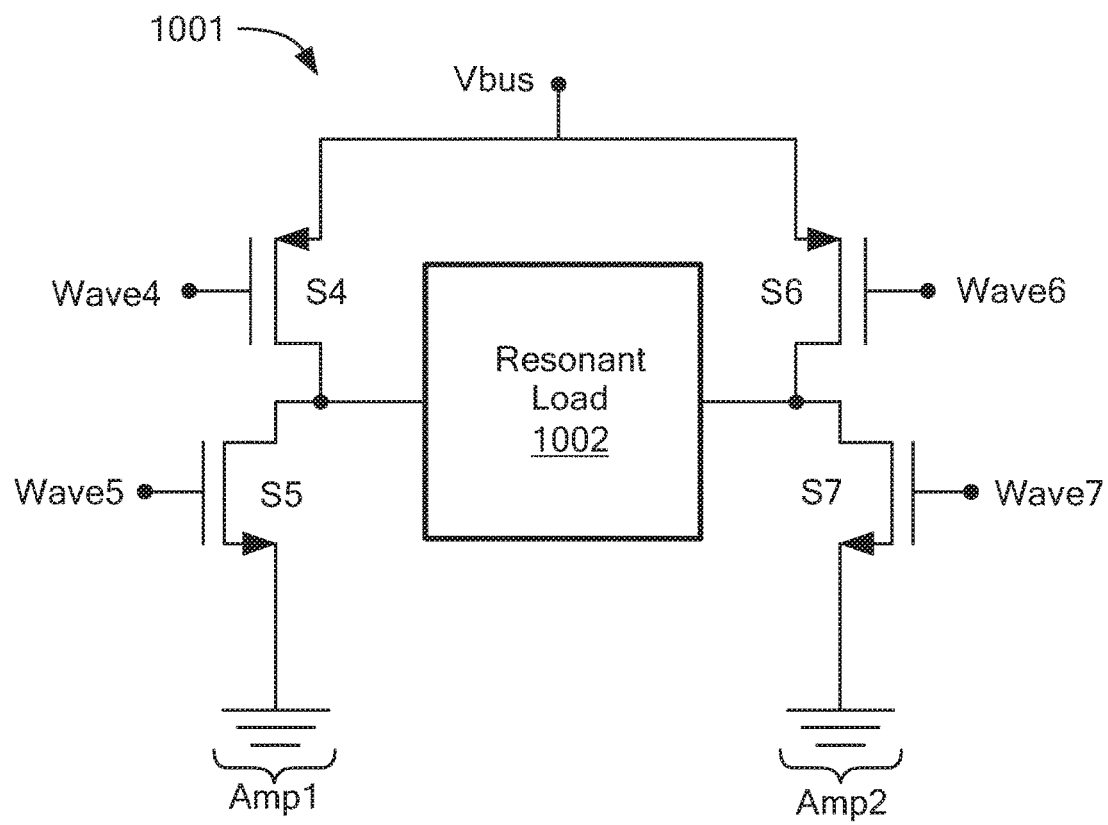
FIG. 10B shows a diagram of push Amp1 and pull Amp2 amplifier components coupled across a load.

In embodiments, PWM is performed by one or more PWM generators (see, for example, 212, 214, 216 in FIG. 2) to control switching elements to drive a load. FIG. 10A shows a converter 1000 having switching elements S1-S3 controlled by PWM drive signals Wave0-3, respectively. FIG. 10B shows push Amp1 and pull Amp2 amplifier components of an inverter or amplifier 1001 coupled across a load 1002. The amplifier switching elements S4-S7 are controlled by respective PWM drive signals Wave4-7. Note that bus voltage Vbus is provided by the converter and/or power supply preceding the amplifier (see FIG. 1).

In embodiments, in reference to FIG. 2, the converter PWM module 212 and inverter PWM module 214 generate waveforms to control drive signals for switching elements in the converter 103 and inverter 104. The switching element drive waveforms can be controlled based on periodicity, set by the clock frequency, and a count-up-to-programmable limit counter, for example. Waveform edges, typically two edges (or more, but typically an even number of edges) per period placement, can be set by PWM registers, e.g., COARSE_ON, COARSE_OFF, FINE_ON, and FINE_OFF within the register module as previously described.

In illustrative embodiments, the PWM control registers are provided in two sets (0 and 1). The provision of two sets allows the programmable operating characteristics of the PWM waveforms to be changed while the system is running without upsetting waveform generation: while one set is used, the other is modified, then the two sets may be swapped to change PWM operation.

Generation of the PWM waveforms can include functionality for asynchronous and/or synchronous start control and synchronous reload of waveform pulse width, and for some applications, synchronous reload of waveform period. A single PWM generator can include a single counter mechanism (period counter) used to generate one or more waveforms to control switching elements.

For systems with two or more PWM generators, e.g., transmitter control systems 308, period counters in the multiple PWM generators can be started simultaneously. In one embodiment, a common control signal (EX_RUN, selected from the pins GPIO[3 . . . 0] pins within each PWM group) to turn multiple period counters on.

The common control signal can also be controlled from within the transmitter control system for common control within the system or for common control between multiple devices by driving the signal out of the controlling device via GPIO pins. For some applications, the mechanism includes a common control signal, separate from the previously-mentioned control signal, to change the pulse width in a manner that is common to all generators.

In embodiments, multiple PWM generators can have a common periodicity but the waveform on and off edges may be set to define any desired relationship between the multiple PWM generators. Once programmed, the PWM generators are configured to enable start-up based on the state of the EX_RUN signal, for example. By this mechanism, two or more PWM generators may be started in common with a known phase offset, enabling the generation of output waveforms and resultant electromagnetic signals with a known and controllable phase offset.

In embodiments, a mechanism is provided by which these control signals may be external to the integrated circuit, allowing multiple integrated circuits to be controlled by a common signal. A further mechanism is provided by which one of a group of devices can be controlled by an internally-generated control signal while transmitting said signal externally to control other integrated circuits in common.

These pin controls can be operated from within the part using programmatic control, after configuring GPIO[n] (n={0 . . . 3}) as an output pin then setting the value of GPIO[n], or via external inputs to the part, after configuring GPIO[n] as an input pin. The PWM periodicity is set via PWM_COUNT_LIMIT_[k] registers.

Waveform phase and pulse width are set by directly controlling waveform edges, typically two edges (or more, but typically an even number of edges) per period placement The edges are controlled by the {COARSE_ON_x|FINE_ON_x} (x={0 . . . 9}) registers for assertion edges, {COARSE_OFF_x|FINE_OFF_x} registers for deassertion edges.

The primary controller is responsible for setting these register values in the example embodiment, and the register setting operation is performed to the register set {0,1}. Multiple generators and multiple integrated circuits are operated from a common clock, literally (directly or via clock tree distribution) and/or as implied by in-phase control mechanisms as in the example embodiment.

After configuring the multiple, similarly-clocked PWM generators and the trigger mechanisms as described above, the primary controller will assert the in-common trigger mechanisms to the PWM generators causing the generation of waveforms which are synchronous in time and offset by arbitrary phase.

Figure 11:
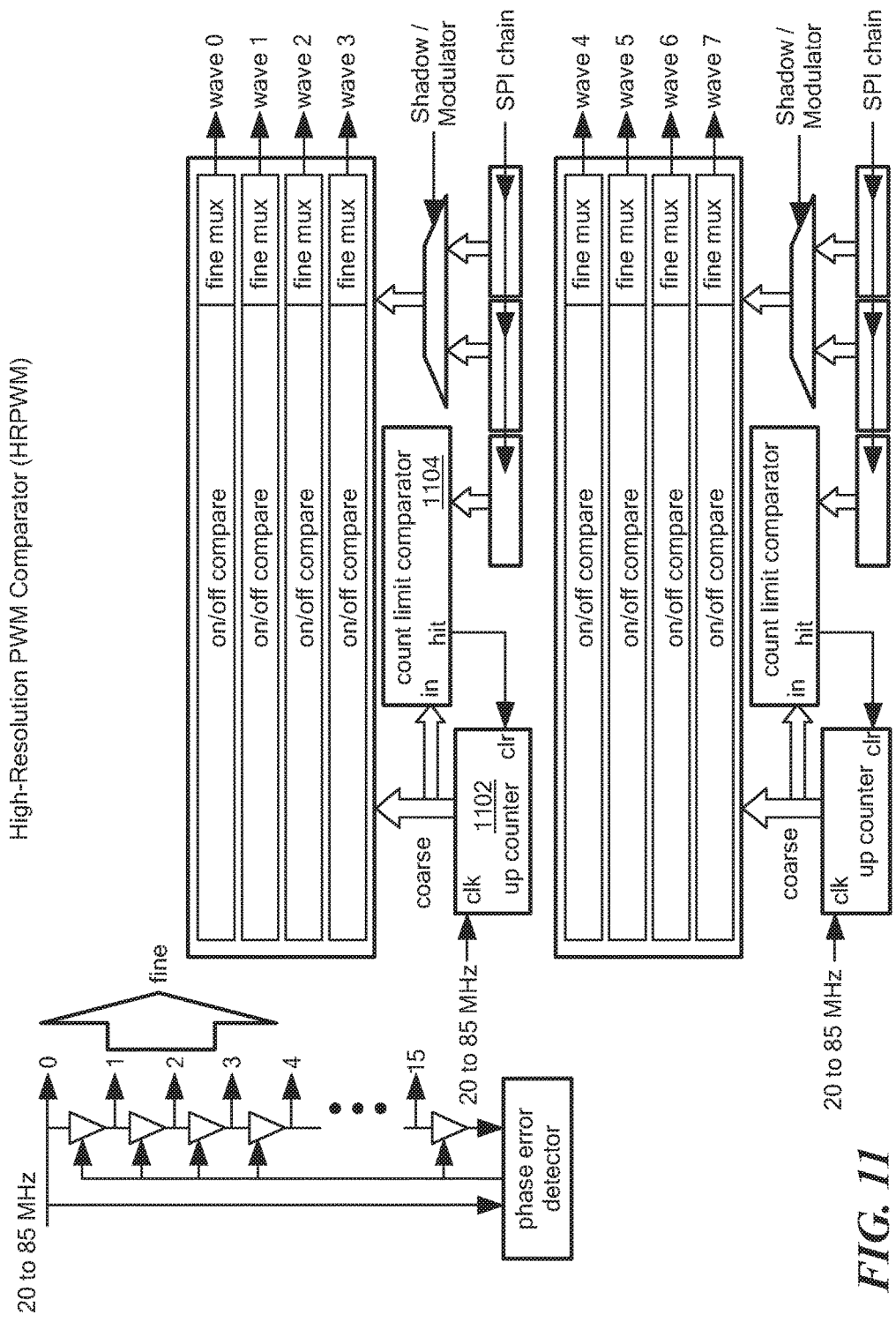
FIG. 11 shows a diagram of a counter to hold a value for a coarse value of PWM driver signal edge and a comparator to determine when the count is reached.

FIG. 11 shows a counter 1102 to hold a value for a coarse value of PWM driver signal edge and a comparator 1104 to determine when the count is reached. An amount of time is added to the coarse edge location to provide fine (high resolution} for the edge of the gate driver signal. A PWM controller, which can include converter PWM module 220 and amplifier PWM module 222 in FIG. 2, provides multiple channels having independently programmable (on/off) although channels are typically grouped by sets of two or four sharing a single period. The number of PWM channels is configurable based on the application.

In the illustrative embodiment of FIG. 2, the controller 202 can include eleven PWM channels, split into four groups:

Group A: four channels: converter control (220 FIG. 2)
Group B: four channels: inverter control (222 FIG. 2)
Group C: two channels: adjustable impedance control (224 FIG. 2)
Group D: one channel: internal timer for sinewave generator.

The illustrative split above into multiple groups allows different PWM periods for each group of channels (example: 6.78 MHz for PWM period in group B; 100 kHz or 250 kHz for PWM period in group A; etc.). In embodiments, a programmable count-up counter, such as that shown in FIG. 11, is shared by all channels in a single group. Each group's count-up value determines the periodicity of the PWMs in that group (A, B, C, etc.). The combination of selecting any input frequency in the given range, and any integer divisor in the range {2 . . . 8192} allows the system to operate at a wide range of PWM frequencies.

Each group {A, B, C, D} count-up limit is stored as COUNT_LIMIT_{A, B, C, D}[12:0]. The register value can be directly loaded. Since the count starts at 0, if you write 60, count is 61, readback is 60. The 'coarse' time-base is defined by the counter, PWM_COUNTER_{A, B, C, D}[12:0], which counts from 0x0 up to the value of COUNT_LIMIT_{A, B, C, D} during each PWM cycle.

Both count-up counters share the same input clock. The illustrative counter clock frequency range {75 . . . 85} MHz allows a wide variety of target PWM frequencies to be precisely generated:

81.3600 MHz/12=6.78000 MHz
15.0 MHz/8192=9.16 kHz

The precision of PWM frequency setting is limited to integer divisors of the counter clock. Precision frequency setting requires a precise counter clock of an integer multiple of the desired frequency. This multiple should be set as high as possible to allow maximum precision in the specification of pulse width.

The counter clock also controls a multi-tap analog delay line for dividing each clock period into high resolution time points. In embodiments, a 17-tap delay line is used, as shown in FIG. 6A. The distance-in-time between taps varies proportional to the period of the counter clock. For a 17-tap delay line, 81.36 MHz (12.3 ns period)/17 taps=723 ps/tap. Duty cycle precision is a function of counter clock period and divisor, for 6.78 MHz (12*17 at 81.36 MHz) a precision of 204 time points per cycle is provided.

In embodiments, PWM waveform assert/deassert times are determined by time-point registers. In one particular embodiment, low-order bits [3:0] specify which of the 17 delay line taps will be used for the precision (high resolution or fine) edge placement high-order bits [13:4] specify the counter value within which the precision edge will be placed.

Example: 6.78 MHz PWM (81.36 MHz/12), COUNT_LIMIT=0xb
   50% duty cycle at time-point [13:4]=0x6; time-point [3:0]=0x0
   25% duty cycle at time-point [13:4]=0x3; time-point [3:0]=0x0
For a 22% duty cycle:
0.22·12=2.64: integer 2, remainder 0.64
0.64·16=10.24: tap #10, time-point [13:4]=0x2; [3:0]=0xa Advantages of HRPWM is readily apparent to one of ordinary skill in the art. For example, noise reduction, for example, in the form of harmonic frequencies, can be achieved during normal operation and calibration. It is understood that FCC regulations limit the energy that can be generated. Precise control over the switching elements in a converter and/or amplifier and control over IMN(s) can significantly improve noise performance.

In embodiments, wanted and/or unwanted harmonic frequencies are sensed, such as by using a wideband amplifier having a notch attenuation filter at the acceptable band with the residual unfiltered signal being out-of-band noise. The magnitude and/or frequency of the out of band noise can also be measured. It is understood that this filtering and measurement can be performed using any suitable technique. By changing circuit operation from "highly filtered" to "detuned", a measurement can be made of the relative difference in amplitude to determine the level of out-of-band energy being transmitted by a system. The PWM waveforms can be adjusted to reduce the noise using coarse and fine edge adjustments to the gate driver signals for rising and/or falling edges of waveforms.

In addition, in embodiments, the wireless power transmitter can be operated with or without a load, which may be optimized or unknown.

Power levels can be adjusted at the wireless power receiver, or multiple receivers, with feedback based on communications between transmitter and one or more receivers. In addition to adjusting amplifier operation, HRPWM can control the converter in order to reduce the voltage being supplied to the RF amplifier.

For increasing the efficiency of power switching in a wireless power transmitter, similar to the above, power adjustment can include feedback based on phase and magnitude measurements to determine the actual impedance so that it can be adjusted by fine amounts to reach the desired impedance resulting in increased power transmission efficiency.

Figure 12:
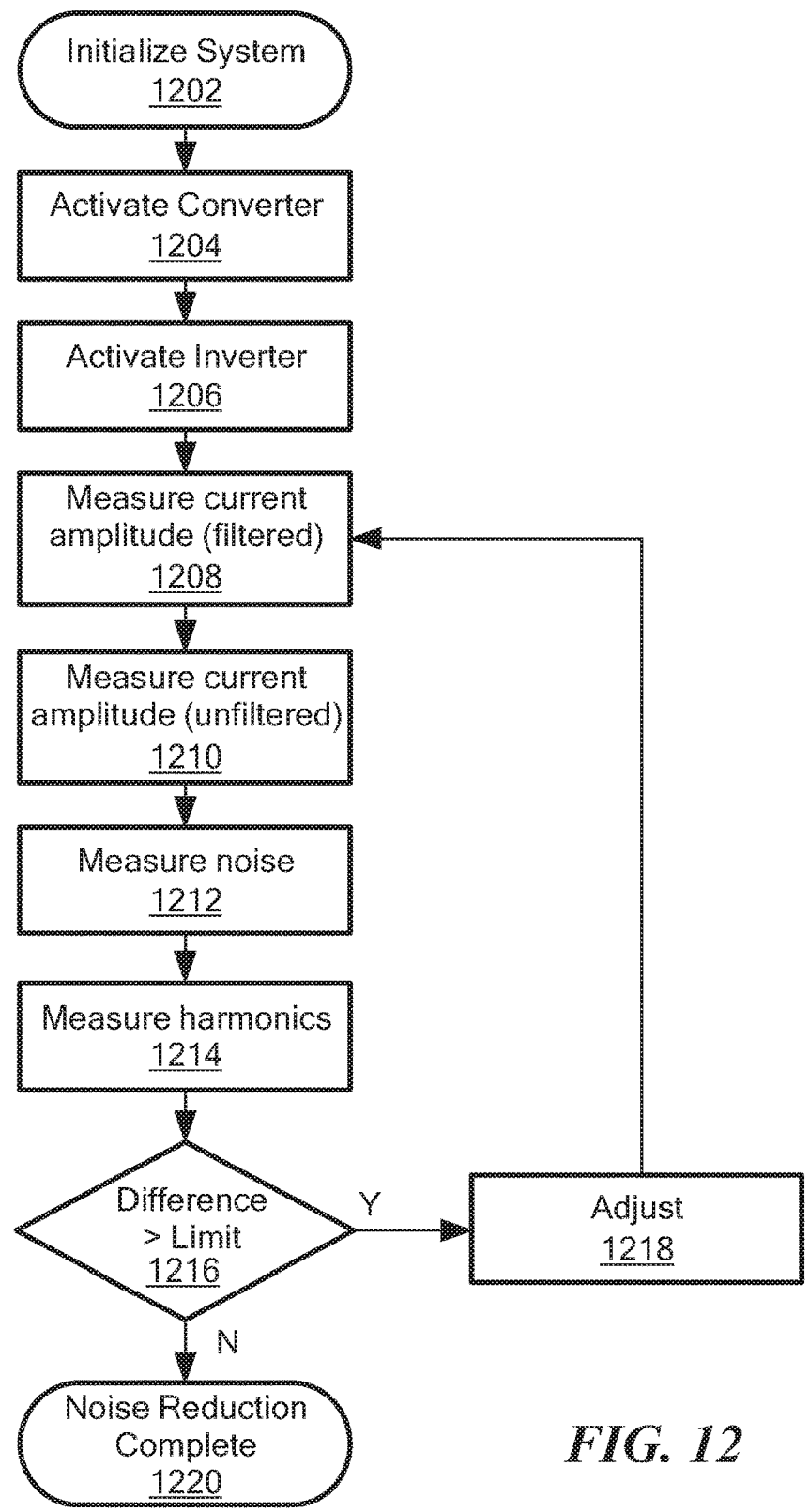
FIG. 12 shows an illustrative set of steps for adjusting gate control signals generated by the PWM generator.

FIG. 12 shows an illustrative set of steps for adjusting gate control signals generated by the PWM generator. In step 1202, the system is initialized. In step 1204, a converter is activated and in step 1206 an inverter is activated. In step 1208, filtered current amplitude is measured and in step 1210, unfiltered current is measured. In step 1212, noise is measured and in step 1214 harmonics are measured. In step 1216, it is determined whether any threshold have been exceeded and/or not met. In step 1216, one or more PWM signals are adjusted. If the threshold has not been exceeded, then noise reduction can be considered complete at step 1220.

In-Band Signaling Using HRPWM

In another aspect of the invention, a wireless power transmission system includes data signaling or data communication between a power transmitter and power receiver by adjusting transmitted power levels in-time to send information (communicate and/or signal) from a transmitter to a receiver. This in-time amplitude modulation (AM) can be provided using amplitude-shift keying (ASK) or other suitable modulation technique.

Figure 13:
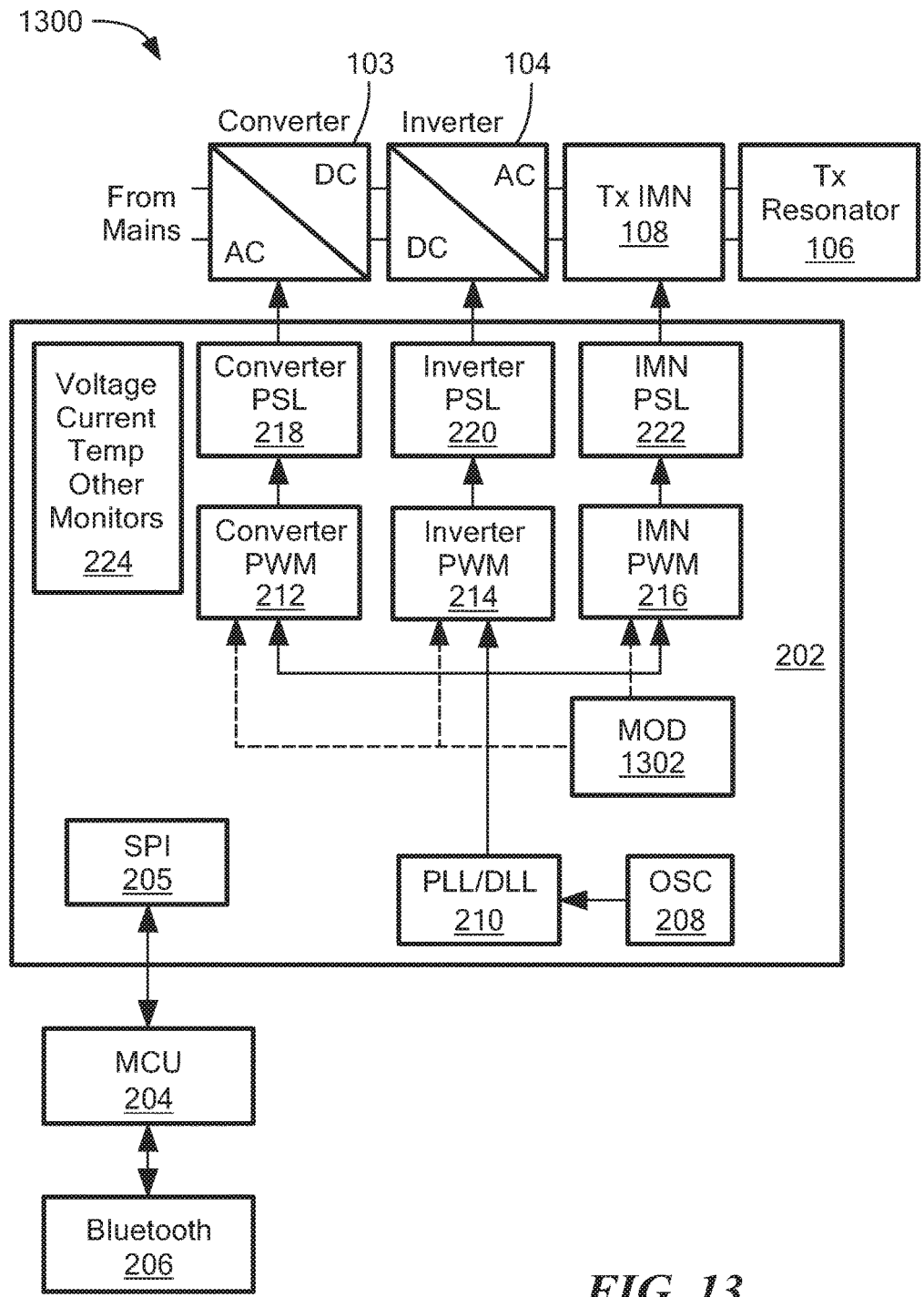
FIG. 13 shows an illustrative wireless power transfer system including a modulation module.

FIG. 13 shows an illustrative wireless power transfer system 1300 having commonality with the system of FIG. 2 with the addition of a modulation module 1302 coupled to the converter PWM module 212, inverter PWM module 214, and impedance adjustment PWM module 216. It is understood that the modulation module 1302 does not need to be coupled to each of these modules. The modulation module 1302 provides information to the PWM module(s) to enable adjustment of the gate drive signals to the switching elements to provide the desired modulation. PWM generators are discussed above for high resolution PWM. It is understood that a receiver has a demodulation module to receive and demodulate the transmitted information. In addition, a receiver can modulate information for transmission to the transmitter by adjusting the impedance seen by the transmitter. The modulation module 1302 on the transmitter can demodulate data sent from the receiver. In embodiments, the modulation module can be integrated into the controller 204.

In embodiments, amplitude modulation (AM), such as ASK, is used. Amplitude-shift keying (ASK) refers to a form of amplitude modulation that represents digital data as variations in the amplitude of a carrier wave. A binary symbol 1 is represented by transmitting a fixed-amplitude carrier wave and fixed frequency for a bit duration of T seconds. If the signal value is 1 then the carrier signal is transmitted; otherwise, a signal value of 0 is transmitted. A finite number of distinct signals are used to represent digital data, as well as, a finite number of amplitudes, each assigned a unique pattern of binary digits.

It is understood that a variety of data types can be communicated to meet the needs of a particular application. In embodiments, exemplary data includes operating parameters, source impedance, allowable load levels and other system dynamics relating to transmitter and receiver power characteristics.

In general, it will be readily appreciated that the data communication should not introduce radio-frequency (RF) noise that can cause the system to operate out of regulatory limits for electrical equipment. It is desirable to provide a noise and harmonic-clean, cost-effective means of sending data from a wireless power transmitter to a wireless power receiver that is buildable in any practical semiconductor or other process.

Figure 14:
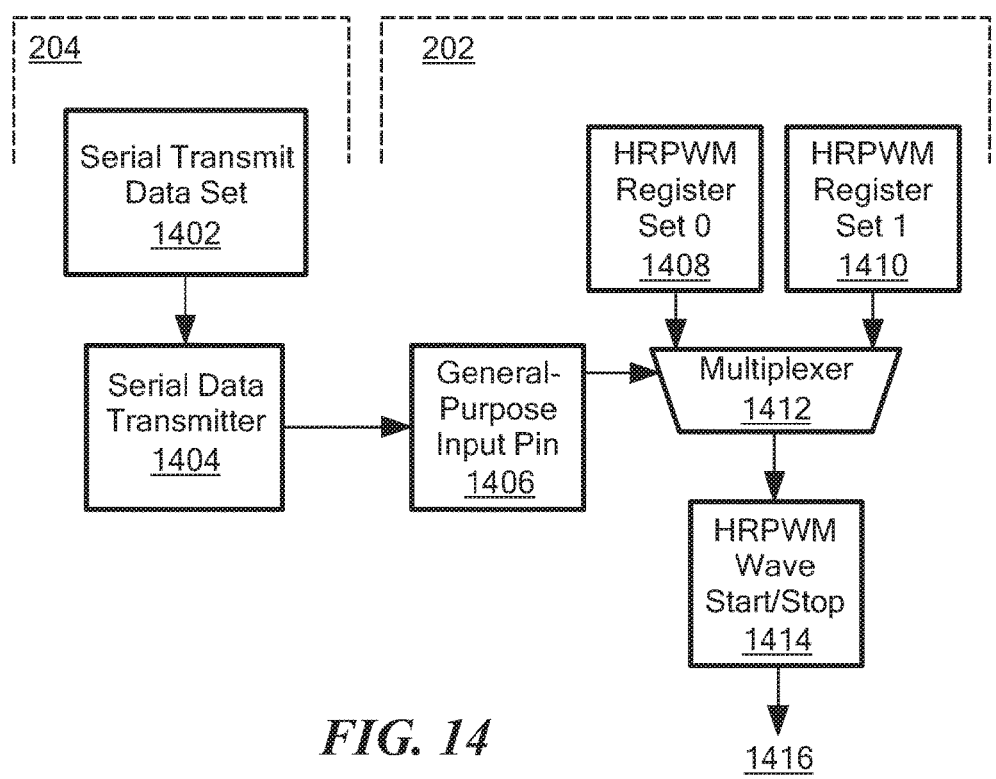
FIG. 14 shows an illustrative embodiment of in-band communication using power modulation.

FIG. 14 shows an illustrative embodiment of in-band communication using power modulation. A processor, such as the microcontroller (MCU) 204 of FIG. 2, is coupled to a transmitter, such as the transmitter control system 202 of FIG. 2. The processor 204 includes a serial data set module 1402 that can store programmed modulation data, such as parameter information, data requests for the receiver, etc. A serial data transmitter module 1404 communicates with the transmitter control system 202, such as by connection to a general purpose or other IO pin 1406.

In embodiments, the transmitter control system 202 includes first and second HRPWM register set 0 (1408) and set 1 (1410) that can store information to control the PWM gate driver signals for generating respective amplitude levels to effect amplitude modulation. For example, the first register set can provide an amplitude level for a digital ONE and the second register set can provide an amplitude for a digital ZERO. A multiplexer 1412, which is coupled to the IO pin 1406, can select the appropriate PWM register set to modulate the signal. It is understood that more complex amplitude modulation can be used, such as by using symbols and additional control signals. In one embodiment, the 6.78 MHz signal discussed above is used for modulation. In embodiments, power can be set as high as possible so that amplitude changes are as small as possible while being detectable. In embodiments, the multiplexer 1412 output is coupled to a start/stop module 1414 that controls the PWM waveforms for beginning and ending modulation for output 1416.

The PWM control registers 1408, 1410 allow the programmable operating characteristics of the PWM generator to be changed while the system is running without upsetting waveform generation: while one set is used, the other is modified, then the two sets may be swapped to change PWM operation. The PWM generator includes functions to perform the synchronous reload of waveform pulse width. When used for modulation, both sets of PWM control registers 1408, 1410 are programmed, each to represent a distinct transmit power level.

In embodiments, PWM control allows transmit data to be represented as multi-variable symbols, as well as simple binary symbols, by adding additional sets of control registers (beyond the example sets 0 and 1), such as quarnary symbols (two bits per symbol) by switching between four sets of control registers (increasing the number of sets $\{0,1\}$ to sets $\{0,1,2,3\}$). Control is achieved by replacing UART control by a control loop in the processor to operate additional control signals (increased from 1 to 2 control signals) to direct symbol encoding, or by another mechanism.

Embodiments allow transmit data to be represented as variations in time, such that the symbol rate can be varied in time to provide additional communications information, by replacing the UART control by a control loop in the processor to modulate symbol transition rates to create a transition-based representation of data in the time domain, for example.

The modulation process may also be employed in wireless power receivers for communication in the reverse direction. In that situation, the PWM control in the power receiver is modified to adjust the load seen by the transmitter. When this modification is performed under the control of a data stream in the receiver, the change in load can be detected by the transmitter by monitoring variations in effective impedance and thus extracted as demodulated data. No additional external circuitry is required to perform modulation and the new modulation process does not affect tuning of the receiver, an aspect of wireless power transfer when operating in common resonance with a transmitter.

In embodiments, GPIO[3:0] pins can be used as trigger mechanisms for changing the output power from HRPWM module-controlled amplifiers via the system's 'flip' operation. Control register set (0,1) can be swapped/flipped via GPIO[3:0] pins as they may be configured to act as trigger mechanisms for HRPWM module 'change pulse width' operation.

These pin controls can be operated from within the part using programmatic control, after configuring GPIO[n] (n=$\{0 \ldots 3\}$) as an output pin then setting the value of GPIO[n], or via external inputs to the part, after configuring GPIO[n] as an input pin.

The PWM periodicity is set via PWM_COUNT_LIMIT_[k] registers. The flip operation will also change this register which can be used as another mechanism for adjusting PWM power. The most direct method for adjusting PWM power is performed by adjusting the duty cycle ('on' time versus 'off' time) of the PWM waveform. Waveform phase and pulse width are set by directly controlling waveform edges, typically two edges (or more, but always an even number of edges) per period placement. The edges are controlled by the {COARSE_ON_x|FINE_ON_x} (x=$\{0 \ldots 9\}$) registers for assertion edges, {COARSE_OFF_x|FINE_OFF_x} registers for deassertion edges.

The primary controller is responsible for setting these register values in the example embodiment, and the register setting operation is performed to the register set $\{0,1\}$. Multiple generators and multiple integrated circuits are operated from a common clock, literally (directly or via clock tree distribution) and/or as implied by in-phase control mechanisms as in the example embodiment.

After configuring the multiple, similarly-clocked PWM generators and the trigger mechanisms as described above, the primary controller will assert the in-common trigger mechanisms to the PWM generators causing the generation of waveforms which are synchronous in time and offset by arbitrary phase.

Pin Safety Logic (PSL)

In embodiments, pin safety logic (PSL) is provided to prevent gate driver signal waveforms that can damage devices, such as the switching transistors. As will be appreciated, resonant circuits can store significant amounts of energy. If current paths are interrupted, for example, the stored energy will find a potentially destructive path.

Referring again to FIG. 2, converter, amplifier and/or impedance adjustment PSL modules 218, 202, 222 can be provided for protection of power amplifiers controlled by the transmitter control system 202. Protection is provided by programmable cross-channel safe-operating states, as well as flexible driver-inhibit functions and power-limiting controls for each channel PSL also defines the polarity of each output's 'active' state and controls the reset behavior of PWM outputs.

In embodiments, PSL modules perform amplifier on and off control, synchronously or asynchronously, and provide an immediate way for power systems to be throttled, by turning off high-side drivers internally, as a function of level monitors or via SPI write operations, and/or externally, via pin control. PSL modules prevent unintentional errors that can occur during applications development, protecting amplifiers from inverter shoot-through conditions and disables high-side drivers when PWM is not running, to prevent load shoot-through conditions. PSL can also provide support for power regulation functions via high-side turn-off with automatic restart and offers protection mechanisms which prevent restart without host intervention.

In embodiments, where the PWM generator (HRPWM) provides gate timing but does not directly control amplifier gate drivers, the PSL module is employed to define operating states and safe-operating-area (SOA) conditions. PSL configuration settings define whether AFE amplifier control pins are active or inactive and how they transition from active to inactive operations. The PSL module also mixes inputs from a number of comparator outputs and digital controls for the purposes of drive inhibition as a function of fault detection or safe-operating-point management or power regulation. Pin safety logic draws the multi-dimensional issues of amplifier turn-on, PWM polarity, safety and control together into a single block for ease of configuration.

In embodiments, PSL operations, like the HRPWM channels, can be divided into four groups (A, B, C, D). This allows for independent operation, while more than one PSL group can be triggered by the same condition.

Group A: Channels 0,1,2,3; converter control
Group B: Channels 4,5,6,7; inverter (power amplifier) control
Group C: Channels 8,9; Switched capacitor (AZ PWM) control
Group D: Channel 10; Variable frequency control for sinewave generator In each of these groups, the even-numbered channels are considered "high-side" drivers and they are logically paired with the next-higher-numbered (odd; "low-side" driver) channels. In embodiments, Groups A and B can be described as full-bridge controllers, Group C as a half-bridge control and Group D as a single PWM channel. In other embodiments, two channels in either group A or B can be used to drive half-bridge converters or inverters. In other words, this control system can be coupled to power transmitters having various configurations of drive circuitry.

PSL describes interactions between control signals and between channels as "active/inactive". After processing and before transmission to the pin, the per-channel ACTIVE_LO bit translates the active/inactive state into an expected pin level.

Example:
A channel that is driving an NMOS gate would configure ACTIVE_LO='0' (false; pin high is ON)
A channel that is driving a PMOS gate would configure ACTIVE_LO='1' (true; pin low is ON)

In embodiments, channels are paired ({0,1},{2,3},{4,5}, {6,7},{8,9}), conceptually as push-pull pairs, to aid in the definition of error conditions that might cause shoot-through damage to drivers. An error occurs when a channel is asserted at the same time its partner channel is asserted.

For example, FIGS. 10A and 10B show gate control signals for switching elements S0-7. If switches S4 and S7 are conductive, it would be an error for S5 to be conductive at the same time. The PWM modules can control the gate drive signals Wave0-7 to avoid error conditions.

When an error is detected, the per-pair PAIR_ERR_n {n=0,2,4,6,8} status bit is set, this is a persistent state which is cleared by writing a '0' to the status bit. At the moment an error is detected, the output state for the even-numbered channel ("high-side") is inhibited from being active (forced to an 'inactive' state). This setting is persistent, remaining until the status bit is cleared via SPI write, after which the force-inactive function is asynchronously released.

Current and/or voltage measurements can be provided to level comparators (LMON) and sent to the PSL as inputs to amplifier protection and/or regulation functions. The PSL generates independent logic functions based on comparator results and other digital inputs. Input fault functions are provided: one independent function for each of the three PWM channel groups A, B and C. In embodiments, the fault functions have 9 or 10 external inputs, where each includes the nine inputs of Comparators 0-8.

Groups A and B can include a 10th input, from pin INHA or INHB, respectively. Each input may be masked locally, providing a configurable AND-OR operation. The mask is unique for each group. The function control register includes bits MASK_CMP[8:0] and MINH_PIN (for groups A and B). An addition control register SW_INH is local to each group's function, provided to allow direct software control (forcing) of the protection function.

Figure 15:
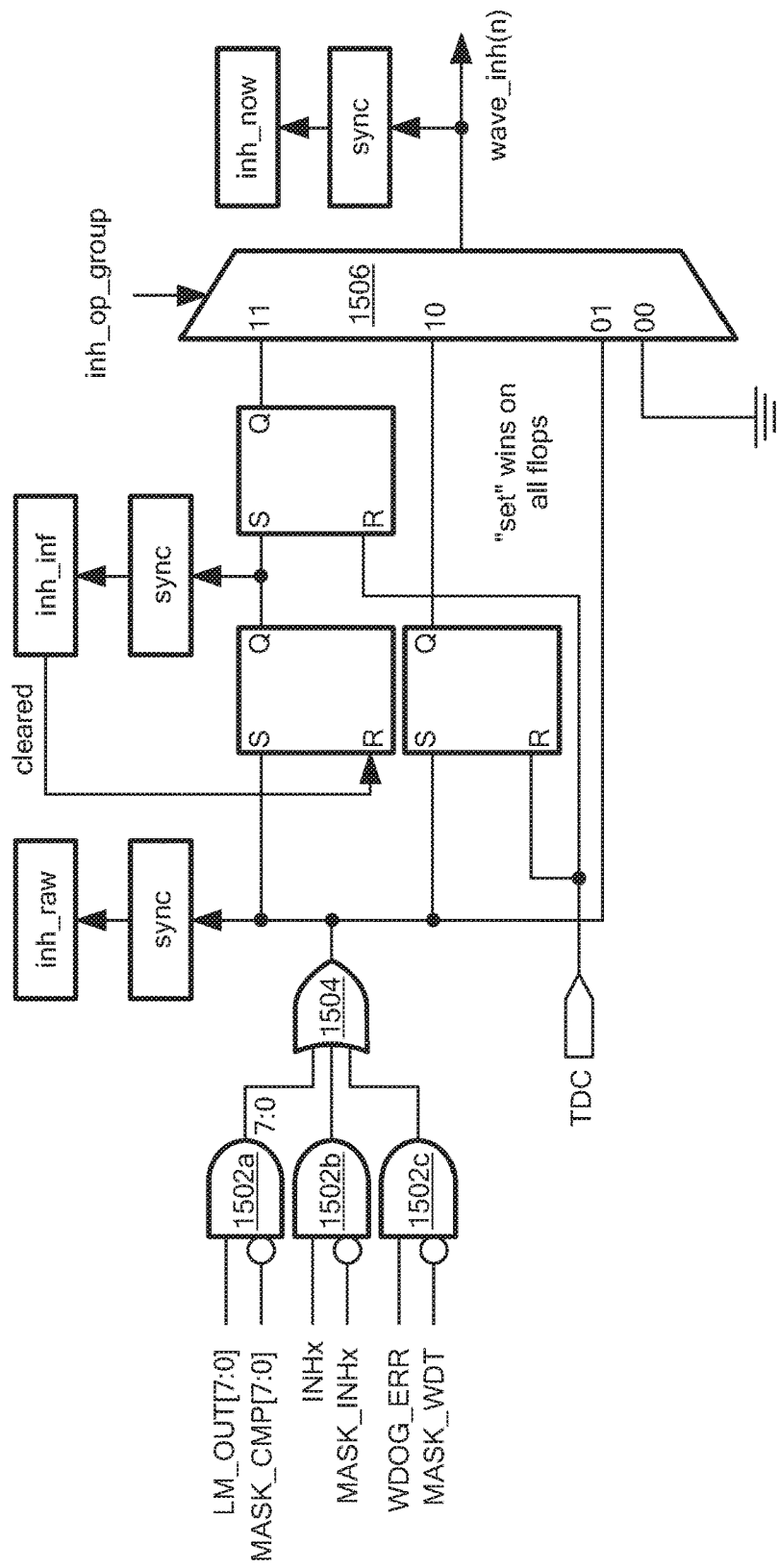
FIGS. 15-16 show illustrative embodiments of PSL.
Figure 16:
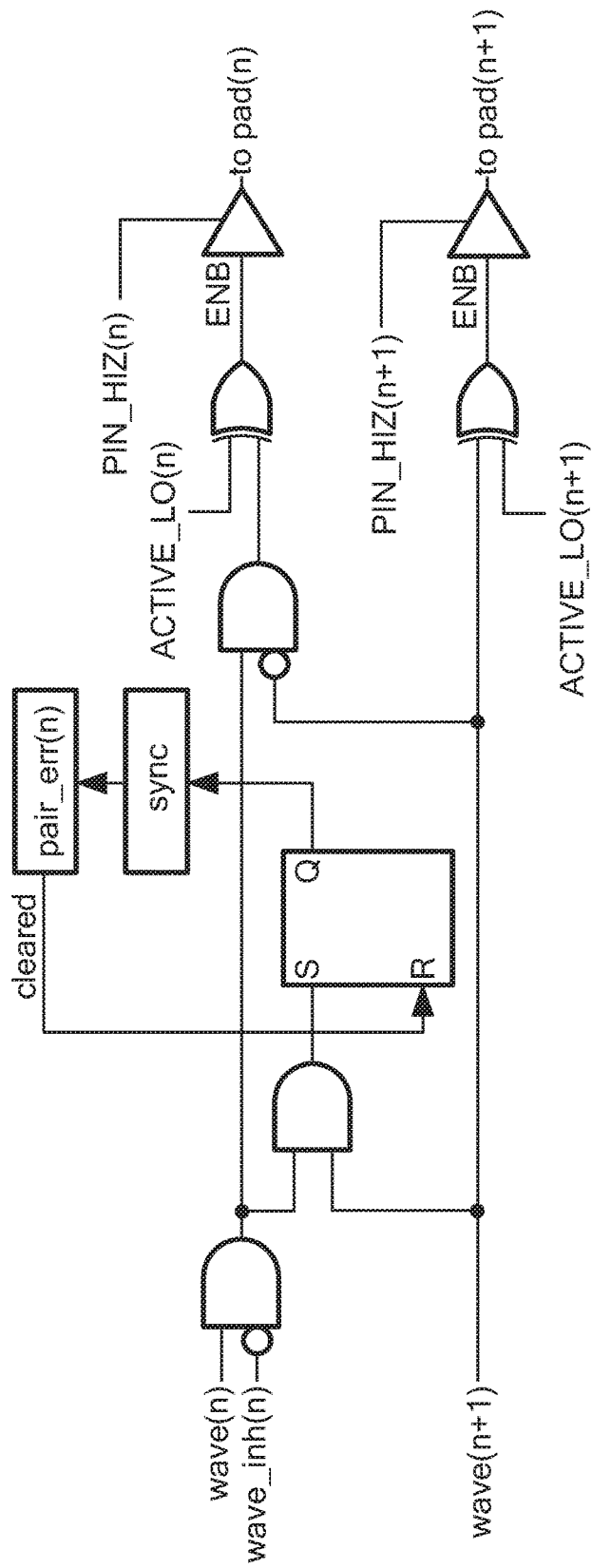

FIGS. 15-16 show illustrative embodiments of PSL. In FIG. 15, LM_OUT (e.g., excess current), INHx, and WTDG (watchdog timer) are optionally masked into gates 1502a, b,c, and pass through logic gate OR 1504 to produce an output to a multiplexer (or mux) 1506. SW_INH provides software inhibit control and is also provided to the multiplexer 1506. TDC can be used to reset the mux. TDC refers to a point corresponding to low or minimal energy in a resonant load. The mux output generates wave_inhm, for an even channel in the illustrated embodiment.

The PWM module can continue running when a fault occurs, only the high-side (even-numbered channel) outputs are affected by being made inactive (off) during a period as defined by the control bits for the mux 1506. The logic associated with INH_OP_GROUP_n[1:0] {n=A,B,C} is defined in the following:

00: Ignore fault function, INH_NOW_n remains low, high-side (even) channels in group are unaffected.
01: Allow fault function to asynchronously control high-side channels in group.
10: Latch fault function, auto-clear on next TDC, control high-side channels in group. Intended for regulation functions. Fault function will not disable until fault cause is removed.
11: Latch fault function, clear on next TDC after INH_INF_n is cleared, control high-side channels in group. Intended for protection functions. Fault function will not disable until fault cause is removed.

As shown in FIG. 16, while a fault function is active, the high-side (even) channels in the group will be inhibited (disabled/"forced off"). In the illustrated embodiment, the signal wave_inh from the mux 1506 (FIG. 15) is gated with a waven(even) signal, while the waven(odd) signal is not. The output signals padn can be connected to the amplifier, converter, etc., to control the switching elements, as described above.

Each of the function outputs each generate a trio of status flags, based on the same AND-OR function with different time signatures:

INH_INF_n {n=A,B,C} is a persistent flag reporting whether the fault/inhibit function has been active at any time since the last time this status flag was written with '0'.
INH_NOW_n {n=A,B,C} is a read-only flag reporting whether the fault/inhibit function is now active. Note that, due to delays caused by synchronous automatic clearing behavior, this flag may be set even though the causal event is no longer active (see INH_RAW flag).
INH_RAW_n {n=A,B,C} is a read-only flag reporting whether the cause of the fault/inhibit function is now active. Note that if INH_OP_GROUP_n=00, this INH_RAW_n has no effect on pin logic.

Regardless of the state of HRPWM channel outputs or possible fault conditions, the output pins may be independently enabled or disabled. Enabled pins have active push-pull drive, disabled pins are undriven. Control register bits PIN_HIZ_n {0 . . . 9} control and report the state of drive control. At system reset, all drive pins are disabled (no driver active), allowing external weak resistors to establish default state for the amplifier's power devices. This mechanism should not be used to 'safe' the amplifier while a resonant load is being driven as it can lead to excessive power dissipation in external transistors as the now-uncontrolled load is discharged.

In embodiments, PSL can prevent a variety of undesirable conditions including protecting wireless power transmitter circuits from processing too much energy and damage from currents and voltages that may be drawn through a binary-switched transistor amplifier in excess of levels that the transmitter is designed to carry. PSL can also can reduce the transmission of excess power to unintended receivers. Unintended receivers of wireless power, such as pieces of metal, metal-coated material or electronic devices (such as RFID or NFC tags) that are not designed to receive wireless power, can be damaged or destroyed by transmissions of wireless power. Controlling the level of transmitted power can reduce the risk of damage to unintended receivers of wireless power. Embodiments can also control the level of power transmitted to effect source-controlled regulation purposes to increase operating efficiency.

Controlling the level of power transmitted power increases the overall efficiency of the transmitter system by reducing the amount of unwanted energy that might be received. Unwanted energy is typically discarded as dissipated heat. In addition, embodiments provide protection that can be used to only prevent one of the series-configured transistors from enabling while the other transistor remains enabled. This allows the transistor circuit to continue to operate but eliminates the power input to the transistor stack. When the device is used to control loads which are in resonance, this ability to continue to draw energy out of the resonant load while preventing energy from entering the resonant load affords essential protection and control of the energy in the system and reduces the risk of loss of control of energy in the resonator which might otherwise occur if the detected error were used to simply turn off the transistors in the amplifier.

Illustrative embodiments are shown and described having Class-D amplifiers. A Class-D amplifier has four control signals, split into two pairs. Each pair will control a pair of transistors, arranged in a series stack between bias supply and ground return. Connecting one terminal of a load to the common center point between the transistors, the pair of control signals can cause the bias seen by the load to vary from bias supply to ground return levels. If another terminal of the load is connected to another pair of transistors, controlled by a pair of waveforms generated in the same group, complex interactions in the control of the four transistors can cause a wide range of interesting and useful variations in bias level and relative polarity across the load.

A "buck-boost" converter has different return paths but share similar concerns as the Class-D configuration with excess power feed-through between the pairs of series-connected transistors in the circuit.

The system monitors the state of each signal in a pair of signals. If, at any time, both signals in a pair are simultaneously active, the slave signal is made inactive. This function can be enabled on a temporary basis or optionally latched to prevent further activation of the slave signal until intervention by external control processes in the processor. In both cases, the erroneous condition is latched and may be optionally signaled to external control processes via the INT pin.

The system includes a variety of control signals. Several of the analog signals in the system, including voltages and current measurements, are processed through programmable level comparators. The state of these comparators are a set of binary control signals which change based on the relationship between the analog signal and the programmed level of the comparator, and the relative magnitude (relative polarity). Several external pins can be configured to provide binary control signals based on the external state of binary signals in the system.

Driving Multiple Resonators

Figure 17A:
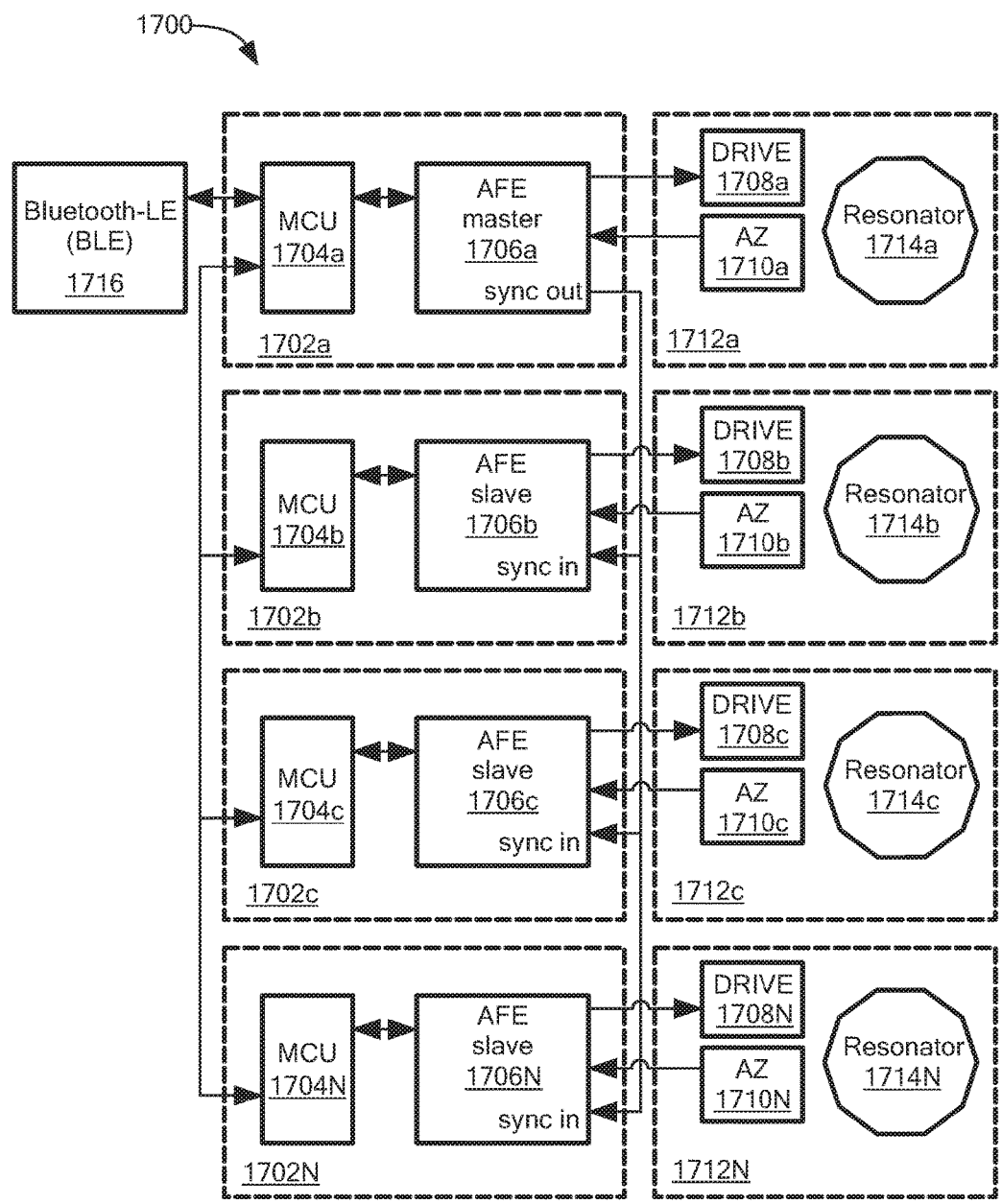
FIGS. 17A-17B show a schematic representation of an illustrative wireless power transmitter system for driving multiple resonators.

FIG. 17A shows a schematic representation of an illustrative wireless power transmitter system 1700 for driving multiple resonators. While the system 1700 is shown having four resonators, it is understood that any practical number of resonators and associated circuitry can be used.

A first power transmit subsystem 1702*a* includes a first processor 1704*a*, such as a microcontroller or digital signal processor, coupled to a first transmitter control system 1706*a*, such as the transmitter control system 202 of FIG. 2. The first power transmit subsystem 1702*a* is coupled to a drive module 1708*a* and an impedance adjustment module 1710*a* (which can be a part of the IMN), which form part of a first wireless transmitter module 1712*a*. It is understood that the drive module 1708*a* can include the converter and amplifier modules 208, 210 of FIG. 2, for example. The first wireless transmitter module 1712*a* further includes a resonator 1714*a*, which can be coupled to an IMN, as shown in FIG. 2.

Further transmit subsystems 1702*b*-N are shown coupled to respective further wireless transmitter module 1712*b*-N. In the illustrated embodiment, the first power transmit subsystem 1702*a*, and more particularly, the first digital signal processor 1704*a* is coupled to the further digital signal processors 1704*b*-N, such that the first digital signal processor 1704*a* is a master and the further digital signal processors 1704*b*-N are slaves. A wireless communication module 1716 is coupled to the first digital signal processor 1704*a*, which controls the further processors 1704*b*-N. Similarly, first transmitter control system 1706*a*, via "sync out", is coupled to transmitter control systems 1706*b*-N, via "sync in" in a master-slave configuration.

Figure 17B:
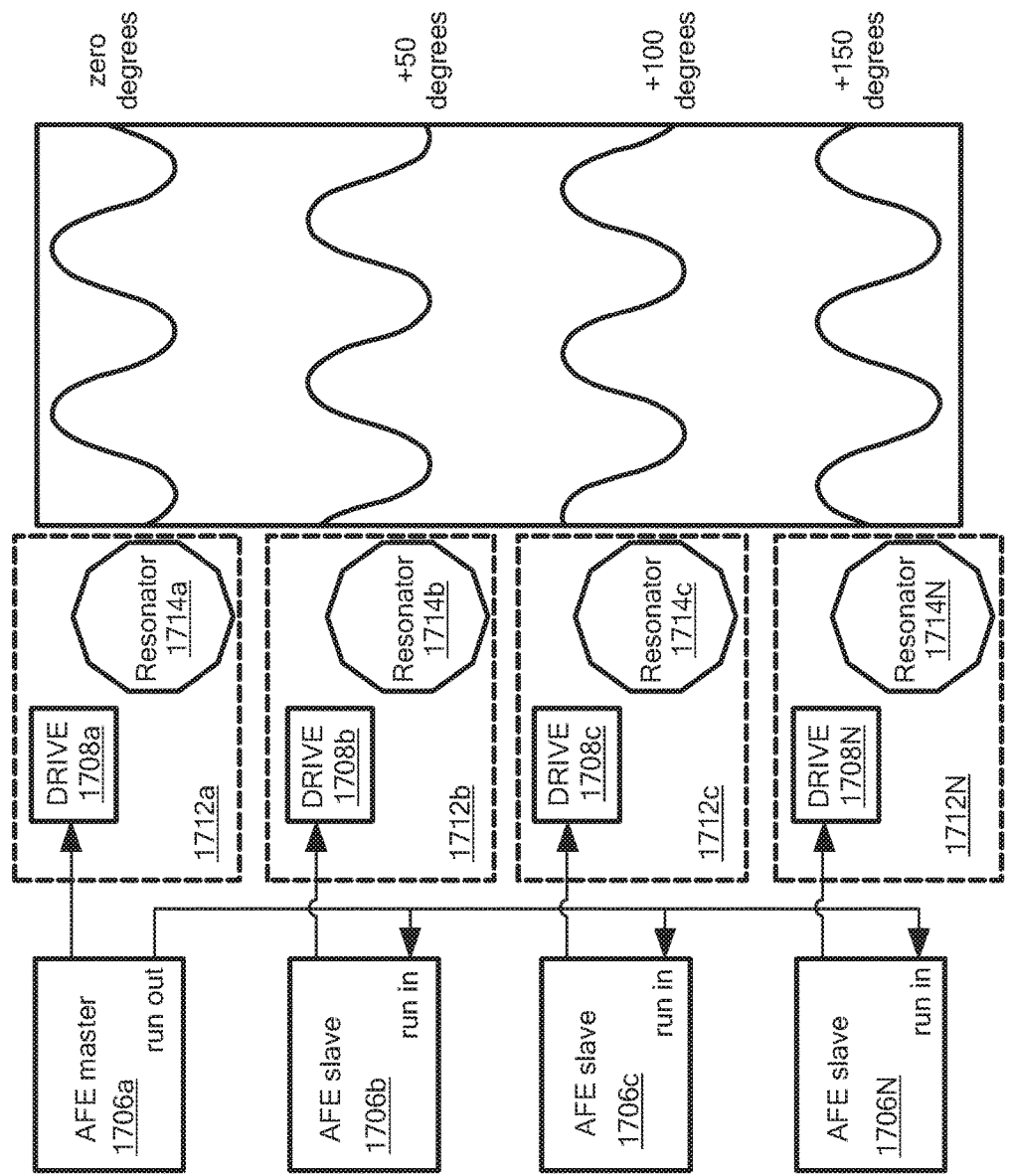

FIG. 17B shows the first transmitter control system 1706*a*, which is the master as shown in FIG. 17A, coupled to the first wireless transmitter module 1712*a*. The further (slave) wireless transmitter modules 1712*b*-N are controlled by respective further transmitter control systems 1706*b*-N.

In embodiments, the multiple resonators 1714*a*-N are actively controlled at the same time. The resonators 1714*a*-N are positioned such that their electro-magnetic fields effectively interact with each other. In embodiments, the phase relationship of the interacting fields is controlled in a desired manner.

FIG. 17B shows the waveforms representing current or voltage at the resonators 1714*a*-N separated by 50 degrees, e.g., first resonator 1714*a* at 0 degrees, second resonator 1714*b* at 50 degrees, third resonator 1714*c* at 100 degrees, and fourth resonator 1714N at 150 degrees. It is understood that any practical degree separation between the generated fields (by resonators 1714*a*-N) can be used and that the field separation need not be equal among all the fields. For a 6.78 MHz clock, and using HRPWM as described herein, a minimum phase offset of the resonator fields can be about 1.76 degrees.

The resonators 1714 are controlled such that their electromagnetic (EM) fields are precisely defined in time and three-dimensional space proximate the resonators. The resonators 1714 can be controlled to generate fields that allow specific amounts of energy to be directed to specific areas in a three-dimensional space. This allows for different devices in that space to receive different, specific levels of power from the resonant transmitter.

Embodiments allow multiple resonant transmitter circuits to operate with precisely defined phase offsets (phase angle differences) for the alternating EM fields. The multiple transmitter circuits can be set at different power levels, or set to sink (remove) power from the common field space. The frequency of transmission and/or power levels and/or phase differences can be simultaneously and synchronously modified in multiple transmitter circuits while transmission is being performed, without stopping transmission to make the desired changes.

Referring again to FIGS. 17A and 17B, primary (master) control is provided by an external microcontroller 1704a which communicates via serial-peripheral interface (SPI). In other embodiments, control is performed by a state machine (SM), and either processor or SM can be either internal to the device or external.

Figure 17C:
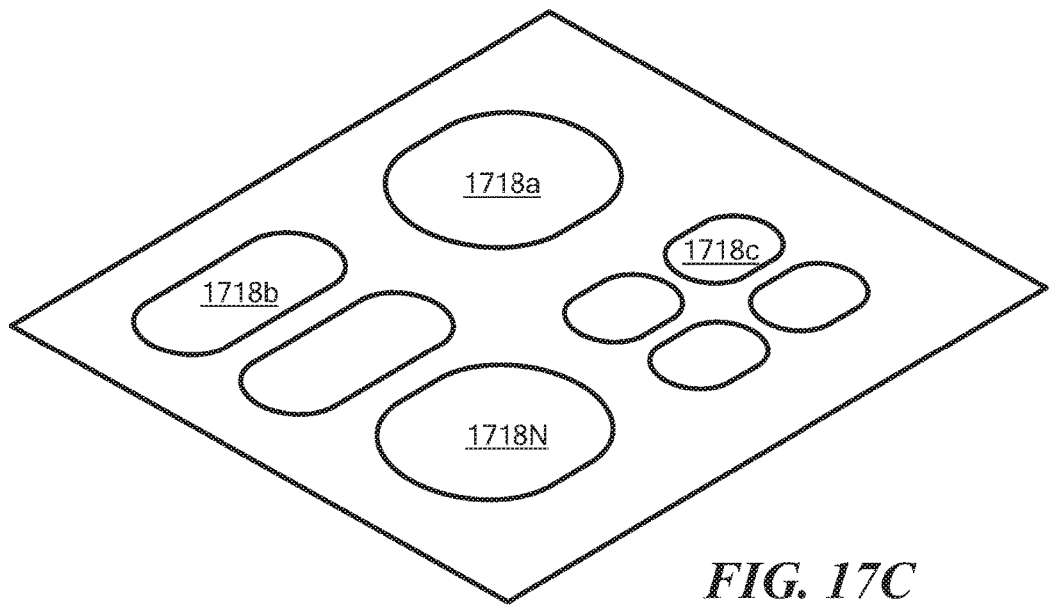
FIG. 17C shows a diagram of exemplary multiple resonators energizing different areas on a surface.

As shown in FIG. 17C, the resonators 1714a-N can energize different areas 1718a-N on a surface, for example. For example, the first resonator 1714a can generate a relatively high power area 1718a that is suitable to charge a laptop (approximately 20-75 W). A second resonator 1714b can generate a further area 1718b with a different power level (for example, lower at 5-15 W to charge a mobile phone). A third resonator 1714c can charge a wearable electronic device at 0.25-5 W at area 1718c. It is understood that the areas 1718 can overlap.

It is understood that inter-resonator phasing can be provided in two and/or three dimensional space and can provide different power levels and the resonator coils can be provided in similar and/or different sizes. In this configuration, the signals generated by the resonators can generate local minima and maxima so that 'hot' and 'cool' spots may occur. It is understood that a 'cool' spot may be desirable if a foreign object, such as a metal object, is detected. In addition, providing excessive energy to say a cell phone is undesirable. In embodiments, wireless communication, e.g., Bluetooth, can be used for communication between transmitters and devices. As described in detail herein, HRPWM can be used for precise control of the gate drivers in the amplifier, for example, to effect the desired phase relationships and to lock in the phase relationships.

Other Embodiments

Figure 18:
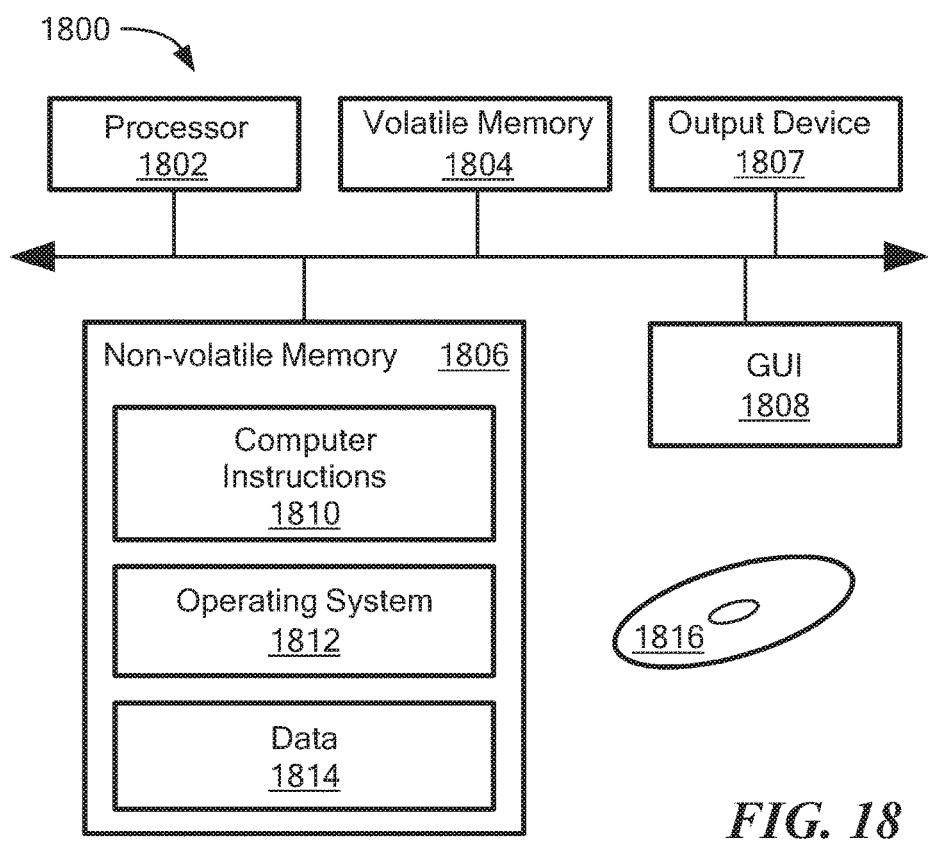
FIG. 18 shows an exemplary computer that can perform at least part of the processing described herein.

FIG. 18 shows an exemplary computer 1800 that can perform at least part of the processing described herein. The computer 1800 includes a processor 1802, a volatile memory 1804, a non-volatile memory 1806 (e.g., hard disk), an output device 1807 and a graphical user interface (GUI) 1808 (e.g., a mouse, a keyboard, a display, for example). The non-volatile memory 1806 stores computer instructions 1810, an operating system 1812 and data 1814. In one example, the computer instructions 1810 are executed by the processor 1802 out of volatile memory 1804. In one embodiment, an article 1816 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination.

What is claimed is:

1. A method for controlling a wireless power transmitter, comprising:
　applying a first low-side driver signal to a first channel in a first pair of channels, wherein the first low-side driver signal controls a first switching element;
　applying a first high-side driver signal to a second channel in the first pair of channels, wherein the first high-side driver signal controls a second switching element, wherein each of the first low-side driver signal and the first high-side driver signal has a state that is "active" or "inactive", wherein the first and second channels are configured to energize a load coupled to the first and second switching elements;
　monitoring the states of the first low-side driver signal and the first high-side driver signal;
　detecting an error condition in the states of the first low-side driver signal and the first high-side driver signal to prevent damaging current flow to the first and second switching elements; and
　when the error condition is detected, setting at least one of the the first low-side driver signal and the first high-side driver signal to "inactive" for a period of time.

2. The method according to claim 1 wherein the error condition corresponds to the first low-side drive signal and the first high-side driver signal for the first and second channels of the first pair of channels being in the "active" state at the same time.

3. The method according to claim 2 further comprising setting the state of the high-side signal on the second channel "inactive".

4. The method according to claim 1 wherein the error condition comprises a current level exceeding a first threshold.

5. The method according to claim 1 wherein the error condition comprises a voltage level exceeding a second threshold.

6. The method according to claim 1 further comprising inhibiting at least one of the high-side and low-side driver signals from being set "active" until the error condition is not detected.

7. The method according to claim 6 further comprising using a status bit to inhibit the at least one of the high-side and low-side driver signals from being set "active" until the error condition is not detected.

8. The method according to claim 7 further comprising setting the signal "inactive" until the inhibit status bit is cleared to 0.

9. The method according to claim 1 further comprising:
applying a second low-side driver signal to a third channel;
applying a second high-side driver signal to a fourth channel, wherein the third and fourth channels comprise a second pair of channels; and
wherein the second channel is coupled to the first switching element of a first bridge, the first channel is coupled to the second switching element of the first bridge, the fourth channel is coupled to a third switching element of the first bridge, and the third channel is coupled to a fourth switching element of the first bridge.

10. The method according to claim 9 wherein the error condition corresponds to the second low-side driver signal and the second high-side driver signal being in the "active" state such that more than one channel in the second pair of channels is active at the same time.

11. The method according to claim 9 wherein the driver signals of the first and second pair of channels drive a converter circuit.

12. The method according to claim 9 wherein the driver signals of at least a third pair of channels drive a power amplifier circuit.

13. The method according to claim 9 wherein the driver signals of at least a third pair of channels drive a switched capacitor circuit.

14. The method according to claim 1 wherein the signal set "inactive" is the second high-side signal on the second channel.

15. A wireless power transmitter control system comprising:
a pulse width modulation control module configured to apply a first low-side driver signal to a first channel and a first high-side driver signal to a second channel in a first pair of channels, wherein each driver signal has a state that is "active" or "inactive" and drives a transistor gate of a switching element, wherein the first low-side driver signal controls a first switching element and the first high-side driver signal controls a second switching element; and
a pin safety logic module configured to monitor the state of each driver signal on each channel and to detect an error condition in the states of the first low-side driver signal and the first high-side driver signal to prevent a damaging current flow condition to the switching elements; wherein when the error condition is detected, the pin safety logic module sets at least one of the the first low-side driver signal and the first high-side driver signal to "inactive" for a period of time.

16. The system of claim 15 wherein the error condition corresponds to the first low-side driver signal and the first high-side driver signal being in the "active" state.

17. The system of claim 16 wherein the pin safety control module sets "inactive" the high-side signal on the second channel.

18. The system of claim 15 wherein the error condition comprises a current level exceeding a first threshold.

19. The system of claim 15 wherein the error condition comprises a voltage level exceeding a second threshold.

20. The system of claim 15 wherein the pin safety control module is configured to inhibit the at least one of the high-side and low-side driver signals from being set "active" until the error condition is not detected.

21. The system of claim 20 wherein a status bit is used to inhibit the at least one of the high-side and low-side driver signals from being set "active" until the error condition is not detected.

22. The system of claim 15 further comprising a third channel and a fourth channel in a second pair of channels, the third channel having a second low-side driver signal applied to it and the fourth channel having a second high-side driver signal applied to it.

23. The system of claim 15, wherein the second channel is coupled to a first switching element of the first bridge, the first channel is coupled to a second switching element of a first bridge, the fourth channel is coupled to a third switching element of the first bridge, and the third channel is coupled to a fourth switching element of the first bridge.

24. The system of claim 23, wherein the error condition corresponds to the second low-side driver signal and the second high-side driver signal being in the "active" state.

25. The system of claim 23, wherein the driver signals of the first and second pair of channels drive a converter circuit.

* * * * *